(12) United States Patent
Stehlik et al.

(10) Patent No.: US 11,727,297 B2
(45) Date of Patent: Aug. 15, 2023

(54) TUNABLE QUANTUM COUPLER FACILITATING A QUANTUM GATE BETWEEN QUBITS

(71) Applicant: International Business Machines Corporation, Armonk, NY (US)

(72) Inventors: Jiri Stehlik, New York, NY (US); Devin L. Underwood, Bronx, NY (US); David Zajac, New York, NY (US); Matthias Steffen, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 369 days.

(21) Appl. No.: 16/910,286

(22) Filed: Jun. 24, 2020

(65) Prior Publication Data
US 2021/0406746 A1    Dec. 30, 2021

(51) Int. Cl.
*G06N 10/40*    (2022.01)
*G06N 10/00*    (2022.01)
*H01L 29/66*    (2006.01)

(52) U.S. Cl.
CPC ............ *G06N 10/00* (2019.01); *G06N 10/40* (2022.01); *H01L 29/66977* (2013.01)

(58) Field of Classification Search
None
See application file for complete search history.

(56) References Cited

U.S. PATENT DOCUMENTS

| 10,491,221 B1 | 11/2019 | Mckay et al. |
| 10,496,934 B2 | 12/2019 | Rigetti et al. |
| 2017/0193388 A1 | 7/2017 | Filipp et al. |
| 2022/0108200 A1* | 4/2022 | Suttle ............... G06N 10/00 |

OTHER PUBLICATIONS

Mundada et al., "Suppression of Qubit Crosstalk in a Tunable Coupling Superconducting Circuit," arXiv:1810.04182v2 [quant-ph], Jun. 3, 2019, 11 pages.

Yan et al. "A tunable coupling scheme for implementing high-fidelity two-qubit gates," arXiv:1803.09813v1 [quant-ph], Mar. 26, 2018, 10 pages.

(Continued)

*Primary Examiner* — Bradley Smith
(74) *Attorney, Agent, or Firm* — Amin, Turocy & Watson, LLP

(57) ABSTRACT

Devices and/or computer-implemented methods to facilitate a quantum gate between qubits using a tunable coupler and a capacitor device are provided. According to an embodiment, a quantum coupler device can comprise a tunable coupler coupled between terminals of a same polarity of a first qubit and a second qubit, the tunable coupler configured to control a first coupling between the first qubit and the second qubit. The quantum coupler device can further comprise a capacitor device coupled to terminals of an opposite polarity of the first qubit and the second qubit, the capacitor device configured to provide a second coupling that is opposite in sign relative to the first coupling.

17 Claims, 10 Drawing Sheets

(56) References Cited

OTHER PUBLICATIONS

Chen, "Metrology of Quantum Control and Measurement in Superconducting Qubits," A dissertation submitted in partial satisfaction of the requirements for the degree of Doctor of Philosophy in Physics, University of California, Jan. 2018, 241 pages.

Mell et al., "The NIST Definition of Cloud Computing," Recommendations of the National Institute of Standards and Technology, NIST Special Publication 800-145, Sep. 2011, 7 pages.

International Search Report and Written Opinion for International Application No. PCT/EP2021/066155 dated Oct. 7, 2021, 22 pages.

Loft Niels et al: "Quantum interference device for controlled two-qubit operations," Aug. 17, 2019 (Aug. 17, 2019), pp. 1-20, XP055843630, arXiv.org Retrieved from the Internet: URL:https://arxiv.org/pdf/1809.09049.pdf [retrieved on Sep. 22, 2021] figures 1, sections II. A and II.B, appendix A.

Ku Jaseung et al: "Suppression of Unwanted ZZ Interactions in a Hybrid Two-Qubit System", Apr. 9, 2020 (Apr. 9, 2020), pp. 1-21, XP055843749, arXiv.org, Retrieved from the Internet: URL: https://arxiv.org/pdf/2003.02775.pdf [retrieved on Sep. 22, 2021] abstract p. 1, right-hand column figures 1, S3.

Examination report No. 1 received for Australian Patent Application Serial No. 2021294837 dated Apr. 21, 2023, 3 pages.

\* cited by examiner

TUNABLE QUANTUM COUPLER FACILITATING A QUANTUM GATE BETWEEN QUBITS

BACKGROUND

The subject disclosure relates to a quantum coupler, and more specifically, to a quantum coupler facilitating a quantum gate between quantum bits (qubits).

In large quantum computing processors nearest neighbor qubits are coupled together in order to generate the qubit-qubit interactions involved with performing quantum gates. When the interactions are always on, unintentional coherent rotations and/or coherent qubit errors occur on spectator qubits (e.g., adjacent qubits) that result in gate errors during quantum computations. Such coherent rotations and/or coherent qubit errors limit qubit performance, and are currently preventing the advancement of quantum computing processors. The coupling between adjacent qubits is a major source of coherent qubit errors; in particular ZZ errors.

Some prior art technologies attempt to eliminate such coherent rotations and/or coherent qubit errors (e.g., ZZ errors) by coupling a tunable coupler to qubits used to perform a quantum gate. A problem with such prior art technologies is that the tunable coupler is designed to operate at a resonant frequency that is above that of the qubits. With a resonant frequency that is above that of the qubits, the ZZ turn on is small, and it becomes more difficult to achieve a fast gate for a broad range of detuning.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate a quantum gate between qubits using a tunable coupler and a capacitor device are described.

According to an embodiment, a quantum coupler device can comprise a tunable coupler coupled between terminals of a same polarity of a first qubit and a second qubit, the tunable coupler configured to control a first coupling between the first qubit and the second qubit. The quantum coupler device can further comprise a capacitor device coupled to terminals of an opposite polarity of the first qubit and the second qubit, the capacitor device configured to provide a second coupling that is opposite in sign relative to the first coupling. An advantage of such a quantum coupler device is that it can improve the speed of a quantum gate (e.g., reduce the time it takes to complete an operation on a qubit).

In some embodiments, the tunable coupler is configured to control the first coupling and the capacitor device is configured to provide the second coupling to eliminate coherent rotations between the first qubit and the second qubit, thereby facilitating at least one of: reduced quantum gate errors associated with at least one of the first qubit or the second qubit; increased speed of a quantum gate comprising the first qubit and the second qubit; improved performance of a quantum processor comprising the quantum coupler device; or improved fidelity of the quantum processor comprising the quantum coupler device. An advantage of such a quantum coupler device is that it can turn off the coupling between the first qubit and the second qubit, thereby eliminating coherent rotations and/or coherent qubit errors on the first qubit and/or the second qubit that cause gate errors during quantum computations.

According to another embodiment, a computer-implemented method of quantum coupling can comprise providing, by a system operatively coupled to a processor, a tunable coupling between terminals of a same polarity of a first qubit and a second qubit. The computer-implemented method of quantum coupling can further comprise providing, by the system, a capacitive coupling between terminals of opposite polarity of the first qubit and the second qubit. The computer-implemented method of quantum coupling can further comprise tuning, by the system, a resonant frequency associated with the tunable coupling. The capacitive coupling generates a coupling that cancels the tunable coupling when the resonant frequency associated with the tunable coupling is smaller than a resonant frequency of both the first qubit and the second qubit. An advantage of such a computer-implemented method of quantum coupling is that it can be implemented to improve the speed of a quantum gate (e.g., reduce the time it takes to complete an operation on a qubit).

In some embodiments, the above computer-implemented method of quantum coupling can further comprise eliminating, by the system, coherent rotations on at least one of the first qubit or the second qubit based on the coupling that cancels the tunable coupling when the resonant frequency associated with the tunable coupling is smaller than the resonant frequency of both the first qubit and the second qubit, thereby facilitating at least one of: reduced quantum gate errors associated with at least one of the first qubit or the second qubit; increased speed of a quantum gate comprising the first qubit and the second qubit; improved performance of a quantum processor; or improved fidelity of the quantum processor. An advantage of such a computer-implemented method of quantum coupling is that it can be implemented to turn off the coupling between the first qubit and the second qubit, thereby eliminating coherent rotations and/or coherent qubit errors on the first qubit and/or the second qubit that cause gate errors during quantum computations.

According to another embodiment, a quantum coupler device can comprise a tunable coupler coupled between a first qubit and a second qubit. The quantum coupler device can further comprise a capacitor device coupled between the first qubit and the second qubit. The capacitor device generates a coupling that is opposite in sign to a coupling from the tunable coupler based on a resonant frequency of the tunable coupler being smaller than a resonant frequency of both the first qubit and the second qubit. An advantage of such a quantum coupler device is that it can improve the speed of a quantum gate (e.g., reduce the time it takes to complete an operation on a qubit).

In some embodiments, the tunable coupler is configured to control the first coupling and the capacitor device is configured to provide the second coupling to eliminate coherent rotations between the first qubit and the second qubit, thereby facilitating at least one of: reduced quantum gate errors associated with at least one of the first qubit or the second qubit; increased speed of a quantum gate comprising the first qubit and the second qubit; improved performance of a quantum processor comprising the quantum coupler device; or improved fidelity of the quantum processor comprising the quantum coupler device. An advantage of such a quantum coupler device is that it can turn off the coupling between the first qubit and the second qubit, thereby eliminating coherent rotations and/or coherent qubit errors on the first qubit and/or the second qubit that cause gate errors during quantum computations.

According to another embodiment, a device can comprise a first tunable coupler coupled between terminals of a same polarity of a first qubit and a second qubit, the first tunable coupler configured to control a first coupling between the first qubit and the second qubits. The device can further comprise a first capacitor device coupled to terminals of an opposite polarity of the first qubit and the second qubit, the first capacitor device configured to provide a second coupling that is opposite in sign relative to the first coupling. The device can further comprise a second tunable coupler coupled between terminals of a same polarity of the second qubit and a third qubit, the second tunable coupler configured to control a third coupling between the second qubit and the third qubit. The device can further comprise a second capacitor device coupled to terminals of an opposite polarity of the second qubit and the third qubit, the second capacitor device configured to provide a fourth coupling that is opposite in sign relative to the third coupling. An advantage of such a device is that it can improve the speed of a quantum gate (e.g., reduce the time it takes to complete an operation on a qubit).

In some embodiments, the first tunable coupler or the second tunable coupler is configured to respectively control the first coupling or the third coupling and the first capacitor device or the second capacitor device is configured to respectively provide the second coupling or the fourth coupling to respectively eliminate coherent rotations between the first qubit and the second qubit or between the second qubit and the third qubit, thereby facilitating at least one of: reduced quantum gate errors associated with at least one of the first qubit, the second qubit, or the third qubit; increased speed of a quantum gate comprising the first qubit and the second qubit or the second qubit and the third qubit; improved performance of a quantum processor comprising the device; or improved fidelity of the quantum processor comprising the device. An advantage of such a device is that it can turn off the coupling between the first qubit and the second qubit and/or the coupling between the second qubit and the third qubit, thereby eliminating coherent rotations and/or coherent qubit errors on the first qubit, the second qubit, and/or the third qubit that cause gate errors during quantum computations.

According to another embodiment, a computer-implemented method can comprise providing, by a system operatively coupled to a processor, a first tunable coupling between terminals of a same polarity of a first qubit and a second qubit, and a second tunable coupling between terminals of a same polarity of the second qubit and a third qubit. The computer-implemented method can further comprise providing, by the system, a first capacitive coupling between terminals of opposite polarity of the first qubit and the second qubit, and a second capacitive coupling between terminals of opposite polarity of the second qubit and the third qubit. The computer-implemented method can further comprise tuning, by the system, a first resonant frequency associated with the first tunable coupling, and a second resonant frequency associated with the second tunable coupling. The first capacitive coupling comprises a first coupling that cancels the first tunable coupling when the first resonant frequency is smaller than a third resonant frequency of both the first qubit and the second qubit, and wherein the second capacitive coupling comprises a second coupling that cancels the second tunable coupling when the second resonant frequency is smaller than a fourth resonant frequency of both the second qubit and the third qubit. An advantage of such a computer-implemented method is that it can be implemented to improve the speed of a quantum gate (e.g., reduce the time it takes to complete an operation on a qubit).

In some embodiments, the above computer-implemented method can further comprise eliminating, by the system, coherent rotations on at least one of the first qubit, the second qubit, or the third qubit based on at least one of the first tunable coupling or the second tunable coupling, thereby facilitating at least one of: reduced quantum gate errors associated with at least one of the first qubit, the second qubit, or the third qubit; increased speed of a quantum gate comprising the first qubit and the second qubit or the second qubit and the third qubit; improved performance of a quantum processor; or improved fidelity of the quantum processor. An advantage of such a computer-implemented method is that it can be implemented to turn off the coupling between the first qubit and the second qubit and/or the coupling between the second qubit and the third qubit, thereby eliminating coherent rotations and/or coherent qubit errors on the first qubit, the second qubit, and/or the third qubit that cause gate errors during quantum computations.

DETAILED DESCRIPTION

Figure 1:
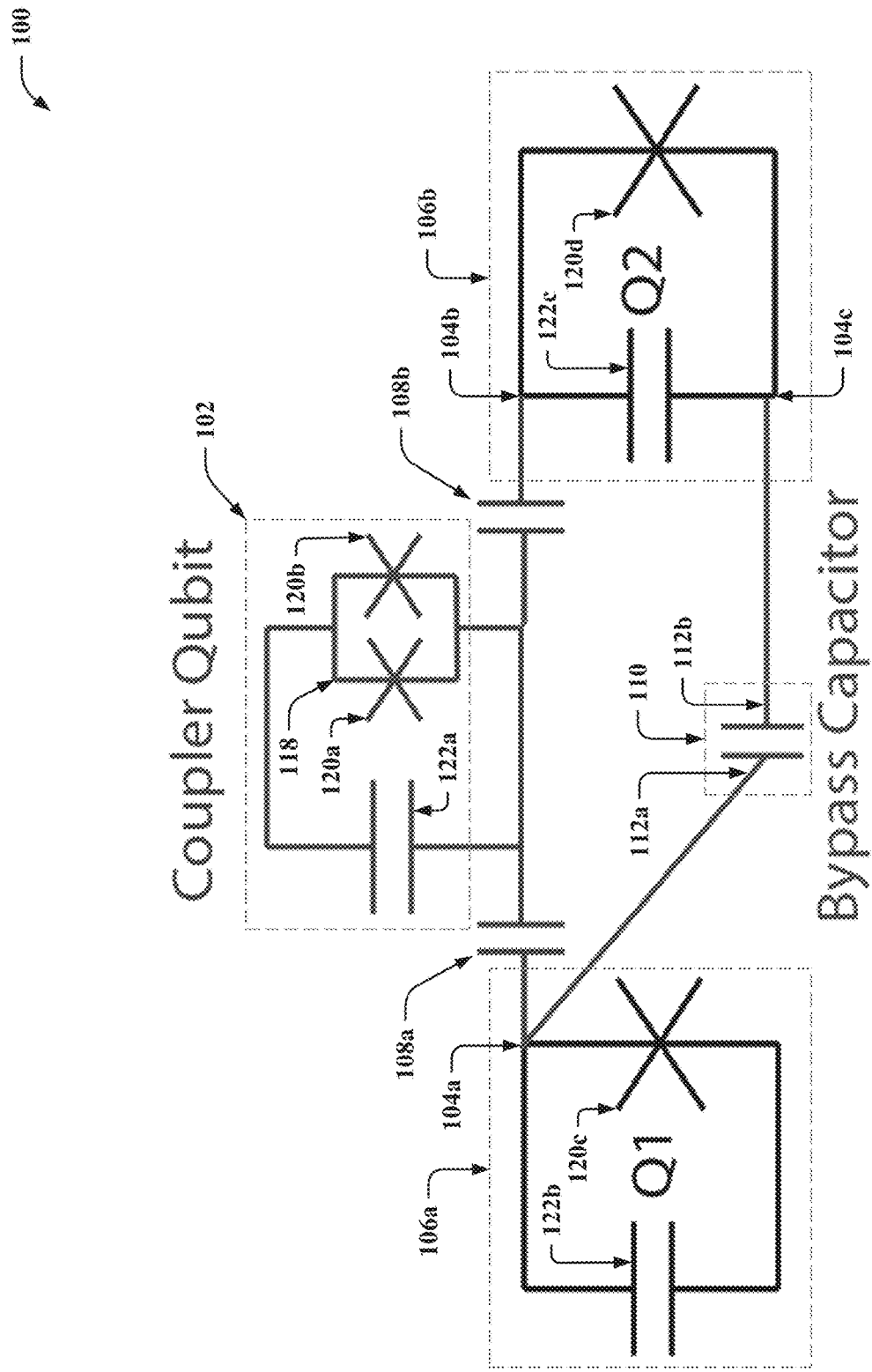
FIGS. 1 and 2 illustrate circuit schematics of example, non-limiting devices that can facilitate a quantum gate between qubits using a tunable coupler and a capacitor device in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing is generally the use of quantum-mechanical phenomena for the purpose of performing computing and information processing functions. Quantum computing can be viewed in contrast to classical computing, which generally operates on binary values with transistors.

That is, while classical computers can operate on bit values that are either 0 or 1, quantum computers operate on quantum bits (qubits) that comprise superpositions of both 0 and 1, can entangle multiple quantum bits, and use interference.

Given the problems described above with prior art technologies, the present disclosure can be implemented to produce a solution to these problems in the form of devices and/or computer-implemented methods that can facilitate a quantum gate (e.g., a controlled phase (Cphase) gate) between a first qubit and a second qubit using a quantum coupler device comprising: a tunable coupler coupled between the first qubit and the second qubit; and a capacitor device coupled between the first qubit and the second qubit, where the capacitor device generates a coupling that is opposite in sign to a coupling from the tunable coupler based on a resonant frequency of the tunable coupler being smaller than a resonant frequency of both the first qubit and the second qubit. An advantage of such devices and/or computer-implemented methods is that they can be implemented to improve the speed of a quantum gate (e.g., reduce the time it takes to complete an operation on a qubit).

In some embodiments, the present disclosure can be implemented to produce a solution to the problems described above in the form of devices and/or computer-implemented methods that can facilitate a quantum gate (e.g., a Cphase gate) between the first qubit and the second qubit using the quantum coupler device described above, where the tunable coupler is configured to control the first coupling and the capacitor device is configured to provide the second coupling to eliminate coherent rotations between the first qubit and the second qubit. An advantage of such devices and/or computer-implemented methods is that they can be implemented to turn off the coupling between the first qubit and the second qubit, thereby eliminating coherent rotations and/or coherent qubit errors on the first qubit and/or the second qubit that cause gate errors during quantum computations.

It will be understood that when an element is referred to as being "coupled" to another element, it can describe one or more different types of coupling including, but not limited to, communicative coupling, electrical coupling, electromagnetic coupling, operative coupling, optical coupling, physical coupling, thermal coupling, and/or another type of coupling. It will also be understood that the following terms referenced herein are be defined as follows:

Quantum gate—can denote an operation performed on a qubit.

Cphase—can denote a controlled phase gate, where Z rotation of one qubit is defined by the state of another qubit.

ZZ—can denote a state dependent qubit interaction that can be used to form a Cphase gate.

Flux-tunable—can denote a device whose frequency depends on magnetic flux.

Transmon—type of superconducting qubit, in which the charging energy $E_c$ is much smaller than the Josephson energy $E_j$.

FIG. 1 illustrates a circuit schematic of an example, non-limiting device 100 that can facilitate a quantum gate between qubits using a tunable coupler and a capacitor device in accordance with one or more embodiments described herein. Device 100 can comprise a semiconducting and/or a superconducting device that can be implemented in a quantum device. For example, device 100 can comprise an integrated semiconducting and/or superconducting circuit (e.g., a quantum circuit) that can be implemented in a quantum device such as, for instance, quantum hardware, a quantum processor, a quantum computer, and/or another quantum device. Device 100 can comprise a semiconducting and/or a superconducting device such as, for instance, a quantum coupler device and/or a tunable quantum coupler device that can be implemented in such a quantum device defined above.

As illustrated by the example embodiment depicted in FIG. 1, device 100 can comprise a tunable coupler 102 (denoted as Coupler Qubit in FIG. 1 and as Coupler Qubit 1 in FIG. 2) that can be coupled between terminals 104a and 104b of a same polarity (e.g., positive (+) or negative (−)) of a first qubit 106a (denoted as Q1 in FIG. 1) and a second qubit 106b (denoted as Q2 in FIG. 1). Tunable coupler 102 illustrated in the example embodiment depicted in FIG. 1 can comprise a superconducting quantum interference device (SQUID) 118 (referred to herein as SQUID 118). In the example embodiment depicted in FIG. 1, SQUID 118 can comprise two Josephson Junctions 120a, 120b (each denoted as an X in FIG. 1) and a capacitor 122a. In various embodiments, SQUID 118 can be used to control the tunability of tunable coupler 102 as described herein (e.g., by applying a magnetic flux threading through SQUID 118). First qubit 106a and second qubit 106b illustrated in the example embodiment depicted in FIG. 1 can respectively comprise a Josephson Junction 120c and 120d (each denoted as an X in FIG. 1) and a capacitor 122b and 122c.

As illustrated by the example embodiment depicted in FIG. 1, tunable coupler 102 can be coupled between terminals 104a and 104b of a same polarity (e.g., positive (+) or negative (−)) of first qubit 106a and second qubit 106b via capacitive couplings represented visually in FIG. 1 as capacitor 108a and capacitor 108b, respectively. Tunable coupler 102 can comprise a tunable coupler including, but not limited to, a flux tunable coupler, a tunable coupler qubit, a flux tunable coupler qubit, a tunable qubit, a tunable bus, a flux tunable qubit bus, and/or another tunable coupler. First qubit 106a and/or second qubit 106b can comprise a qubit including, but not limited to, a fixed frequency qubit, a tunable qubit, a transmon qubit, a fixed frequency transmon qubit, a tunable transmon qubit, and/or another qubit.

As illustrated by the example embodiment depicted in FIG. 1, device 100 can further comprise a capacitor device 110 (denoted as Bypass Capacitor in FIG. 1 and as Bypass Capacitor 1 in FIG. 2) that can be coupled to terminals 104a and 104c of an opposite polarity (e.g., positive (+) and negative (−)) of first qubit 106a and second qubit 106b. As illustrated by the example embodiment depicted in FIG. 1, capacitor device 110 can comprise a first terminal 112a and a second terminal 112b that can be cross coupled between first qubit 106a and second qubit 106b, where tunable coupler 102 can be directly coupled between first qubit 106a and second qubit 106b. For example, as illustrated in FIG. 1, first terminal 112a of capacitor device 110 can be coupled to terminal 104a of first qubit 106a and second terminal 112b of capacitor device 110 can be coupled to terminal 104c of second qubit 106b. Capacitor device 110 can comprise a capacitor device including, but not limited to, a differential capacitor (e.g., a capacitor that connects opposite voltage paddles of a transmon qubit), a bypass capacitor, and/or another capacitor device.

The following describes design rules for capacitor device 110, and/or second capacitor device 210 of device 200 described below with reference to FIG. 2, that can be implemented in accordance with one or more embodiments of the subjected disclosure described herein. It should be appreciated that, in various embodiments, tunable coupler 102, and/or second tunable coupler 202 of device 200 described below with reference to FIG. 2, can yield an exchange interaction (J) between first qubit 106a and second qubit 106b, and/or between second qubit 106b and third qubit 206 of device 200 described below with reference to FIG. 2, that can be approximated by equation (1) below. In should be further appreciated that, in these embodiments, equation (1) defined below can by employed to estimate one or more design specifications of capacitor device 110 of device 100 and/or second capacitor device 210 of device 200.

$$J_{j,k} = \frac{g_1 g_2 (\omega_1 + \omega_2 + j\delta_1 + k\delta_2 - 2\omega_c)}{2(\omega_1 + j\delta_1 - \omega_c)(\omega_2 + k\delta_2 - \omega_c)} \quad \text{Equation (1)}$$

where:

$g_1$ and $g_2$ denote the couplings between first qubit 106a and second qubit 106b, respectively, and tunable coupler 102, and/or the couplings between second qubit 106b and third qubit 206, respectively, and second tunable coupler 202 of device 200 described below with reference to FIG. 2;

$\omega_1$ and $\omega_2$ denote frequencies (e.g., resonant frequencies) of first qubit 106a and second qubit 106b, respectively;

$\omega_c$ denotes frequency of tunable coupler 102; and $\delta_1$ and $\delta_2$ denote the anharmonicities of first qubit 106a and second qubit 106b, respectively, and/or the anharmonicities of second qubit 106b and third qubit 206 of device 200 described below with reference to FIG. 2.

In some embodiments, the bypass capacitance associated with capacitor device 110, and/or second capacitor device 210 of device 200 described below with reference to FIG. 2, can be set (e.g., via computer 1012, system memory 1014, processing unit 1014, an AWG, a VNA, etc.) to produce a qubit to qubit coupling that is opposite is sign of $J_{1,1}$, and greater than or equal to, in magnitude, the magnitude of $J_{1,1}$. For instance, in these embodiments, the bypass capacitance associated with capacitor device 110, and/or second capacitor device 210 of device 200 described below with reference to FIG. 2, can be set (e.g., via computer 1012, system memory 1014, processing unit 1014, an AWG, a VNA, etc.) based on the following device parameters:

1) the anharmonicities of the qubits $\delta_1$ and $\delta_2$ (e.g., the anharmonicities $\delta_1$ and $\delta_2$ of first qubit 106a and second qubit 106b, respectively, and/or second qubit 106b and third qubit 206 of device 200 described below with reference to FIG. 2); and 2) the couplings between the qubits and the tunable coupler $g_1$ and $g_2$ (e.g., the couplings $g_1$ and $g_2$ between first qubit 106a and second qubit 106b, respectively, and tunable coupler 102, and/or between second qubit 106b and third qubit 206, respectively, and second tunable coupler 202 of device 200 described below with reference to FIG. 2).

In various embodiments, tunable coupler 102 can be configured to generate and/or control a first coupling 114 (e.g., a tunable coupling, not illustrated in FIG. 1) between first qubit 106a and second qubit 106b. In various embodiments, capacitor device 110 can be configured to generate and/or provide a second coupling 116 (e.g., a capacitive coupling, not illustrated in FIG. 1) that is opposite in sign relative to first coupling 114 between first qubit 106a and second qubit 106b, where first coupling 114 can be generated and/or controlled by tunable coupler 102 as described above. In these embodiments, capacitor device 110 can generate and/or provide second coupling 116 based on a resonant frequency of tunable coupler 102 being smaller than a resonant frequency of both first qubit 106a and second qubit 106b as described below. For instance, in these embodiments, capacitor device 110 can generate and/or provide second coupling 116 based on a resonant frequency of tunable coupler 102 being smaller than a resonant frequency of first qubit 106a and small than a resonant frequency of second qubit 106b as described below, where such resonant frequencies of first qubit 106a and second qubit 106b can be the same or different.

In an example embodiment, although not depicted in FIG. 1, device 100, tunable coupler 102, and/or capacitor device 110 can be coupled to a pulse generator device that can be external to device 100. For instance, in an example embodiment, device 100, tunable coupler 102, and/or capacitor device 110 can be coupled to a pulse generator device including, but not limited to, an arbitrary waveform generator (AWG), a vector network analyzer (VNA), and/or another pulse generator device that can transmit and/or receive pulses (e.g., microwave pulses) to and/or from device 100, tunable coupler 102, and/or capacitor device 110, where such a pulse generator device can be external to device 100. In this example embodiment, such a pulse generator device (e.g., an AWG, a VNA, etc.) can also be coupled to a computer (e.g., computer 1012 described below with reference to FIG. 10) comprising a memory (e.g., system memory 1016 described below with reference to FIG. 10) that can store instructions thereon (e.g., software, routines, processing threads, etc.) and a processor (e.g., processing unit 1014 described below with reference to FIG. 10) that can execute such instructions that can be stored on the memory. In this example embodiment, such a computer can be employed to operate and/or control (e.g., via processing unit 1014 executing instructions stored on system memory 1014) such a pulse generator device (e.g., an AWG, a VNA, etc.), thereby enabling the pulse generator device to transmit and/or receive pulses (e.g., microwave pulses) to and/or from device 100, tunable coupler 102, and/or capacitor device 110.

Continuing with the example embodiment described above, based on receiving a pulse from such a pulse generator device (e.g., via computer 1012, system memory 1014, processing unit 1014, etc.), tunable coupler 102 can provide a tunable coupling (e.g., first coupling 114) between terminals 104a and 104b of a same polarity (e.g., positive (+) or negative (−)) of first qubit 106a and second qubit 106b. In this example embodiment, based on receiving a pulse from such a pulse generator device (e.g., via computer 1012, system memory 1014, processing unit 1014, etc.), capacitor device 110 can provide a capacitive coupling (e.g., second coupling 116) between terminals 104a and 104c of opposite polarity (e.g., positive (+) and negative (−)) of first qubit 106a and second qubit 106b. In this example embodiment, based on receiving a pulse from such a pulse generator device (e.g., via computer 1012, system memory 1014, processing unit 1014, etc.), tunable coupler 102 can further tune a resonant frequency associated with the tunable coupling (e.g., first coupling 114), where the capacitive coupling (e.g., second coupling 116) generates a coupling that cancels the tunable coupling when the resonant frequency associated with the tunable coupling is smaller than a resonant frequency of both first qubit 106a and second qubit 106b (e.g., smaller than a resonant frequency of first qubit 106a and smaller than a resonant frequency of second qubit 106b).

Continuing with the example embodiment described above, based on receiving a pulse from such a pulse generator device (e.g., via computer 1012, system memory 1014, processing unit 1014, etc.), device 100 can facilitate performing a quantum gate between first qubit 106a and second qubit 106b. For example, as described below with reference to FIG. 3, based on receiving a pulse from such a pulse generator device (e.g., via computer 1012, system memory 1014, processing unit 1014, etc.), tunable coupler 102 can tune the resonant frequency associated with the tunable coupling (e.g., first coupling 114) such that it moves closer to that of first qubit 106a and second qubit 106b and increase ZZ.

In various embodiments, tunable coupler 102 can be configured to control (e.g., via computer 1012, system memory 1014, processing unit 1014, an AWG, a VNA, etc.) first coupling 114 and capacitor device 110 can be configured to provide (e.g., via computer 1012, system memory 1014, processing unit 1014, an AWG, a VNA, etc.) second coupling 116 to eliminate coherent rotations and/or coherent qubit errors (e.g., ZZ errors) on first qubit 106a, second qubit 106b, and/or an adjacent qubit 106c (not illustrated in FIG. 1). In these embodiments, such an adjacent qubit 106c can comprise a qubit that can be formed on device 100 at a location that is adjacent to first qubit 106a and/or second qubit 106b. In these embodiments, based on receiving pulses (e.g., microwave pulses) from a pulse generator device (e.g., an AWG, a VNA, etc.) as described above (e.g., via computer 1012, system memory 1014, processing unit 1014, etc.), tunable coupler 102 and capacitor device 110 can decouple first qubit 106a from second qubit 106b and/or adjacent qubit 106c from first qubit 106a and/or second qubit 106b. In these embodiments, tunable coupler 102 and capacitor device 110 can decouple first qubit 106a from second qubit 106b and/or adjacent qubit 106c from first qubit 106a and/or second qubit 106b based on (e.g., using) the capacitive coupling (e.g., second coupling 116) described above that can cancel the tunable coupling (e.g., first coupling 114) when the resonant frequency associated with the tunable coupling (e.g., the resonant frequency associated with tunable coupler 102) is smaller than the resonant frequency of both first qubit 106a and second qubit 106b (e.g., smaller than a resonant frequency of first qubit 106a and smaller than a resonant frequency of second qubit 106b). In these embodiments, based on such decoupling of first qubit 106a from second qubit 106b and/or adjacent qubit 106c from first qubit 106a and/or second qubit 106b, tunable coupler 102 and capacitor device 110 can thereby eliminate coherent rotations and/or coherent qubit errors (e.g., ZZ errors) on first qubit 106a, second qubit 106b, and/or adjacent qubit 106c. In these embodiments, based on such elimination of the coherent rotations and/or coherent qubit errors, device 100, tunable coupler 102, and/or capacitor device 110 can thereby facilitate: reduced quantum gate errors associated with first qubit 106a, second qubit 106b, and/or adjacent qubit 106c; increased speed of a quantum gate comprising first qubit 106a and second qubit 106b; improved performance of a quantum processor comprising device 100 (e.g., which can comprise a quantum coupler device); and/or improved fidelity of such a quantum processor comprising device 100.

Figure 2:
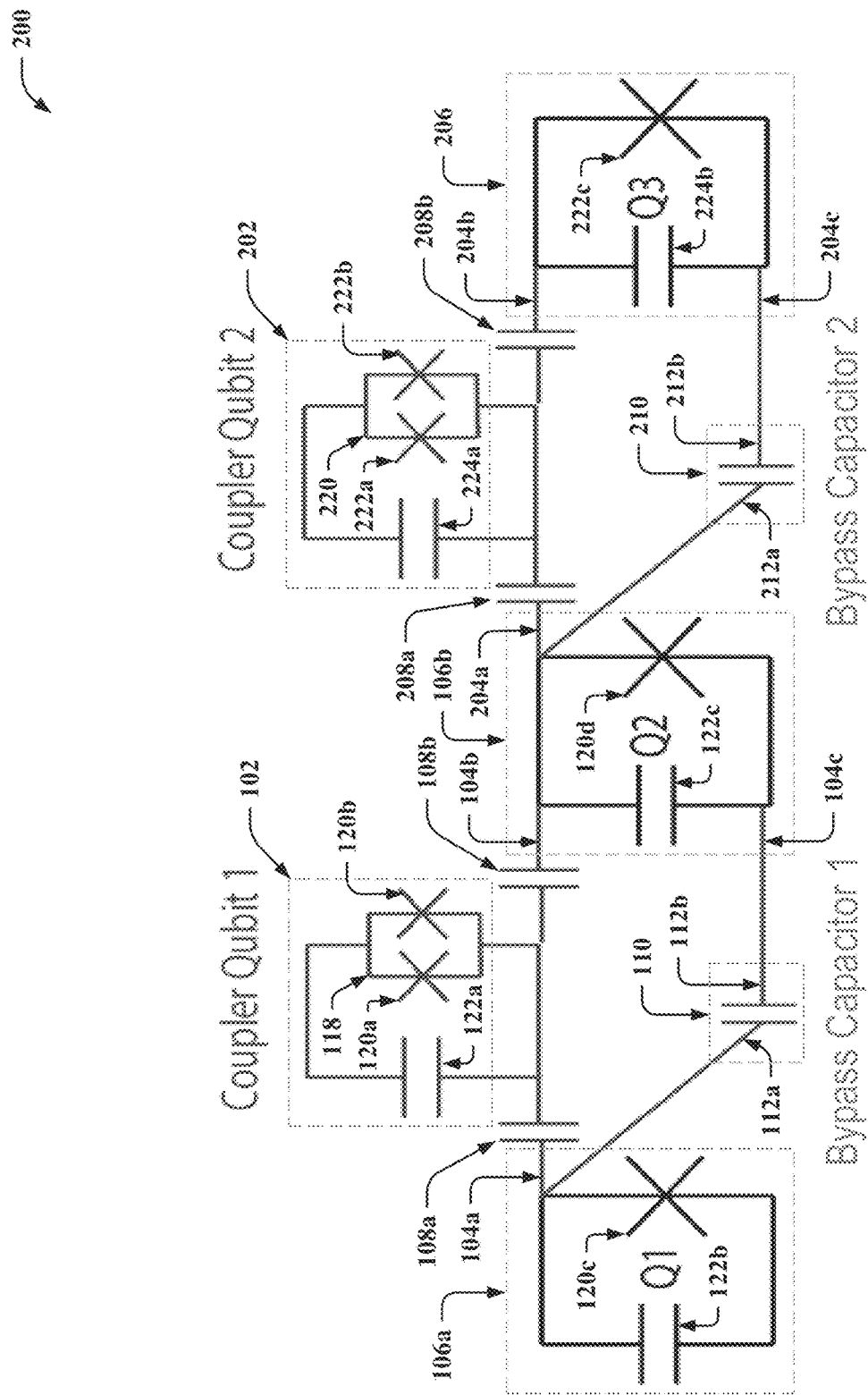

FIG. 2 illustrates a circuit schematic of an example, non-limiting device 200 that can facilitate a quantum gate between qubits using a tunable coupler and a capacitor device in accordance with one or more embodiments described herein. Device 200 can comprise an example, non-limiting alternative embodiment of device 100, where device 200 can comprise an additional tunable coupler and an additional capacitor device coupled to second qubit 106b and further coupled to an additional qubit. Repetitive description of like elements and/or processes employed in respective embodiments is omitted for sake of brevity.

As illustrated by the example embodiment depicted in FIG. 2, device 200 can comprise a second tunable coupler 202 (denoted as Coupler Qubit 2 in FIG. 2) that can be coupled between terminals 204a and 204b of a same polarity (e.g., positive (+) or negative (−)) of second qubit 106b and a third qubit 206 (denoted as Q3 in FIG. 2). Second tunable coupler 202 illustrated in the example embodiment depicted in FIG. 2 can comprise a superconducting quantum interference device (SQUID) 220 (referred to herein as SQUID 220). In the example embodiment depicted in FIG. 2, SQUID 220 can comprise two Josephson Junctions 222a, 222b (each denoted as an X in FIG. 2) and a capacitor 224a. In various embodiments, SQUID 220 can be used to control the tunability of second tunable coupler 202 as described herein (e.g., by applying a magnetic flux threading through SQUID 220). Third qubit 206 illustrated in the example embodiment depicted in FIG. 2 can comprise a Josephson Junction 222c (denoted as an X in FIG. 2) and a capacitor 224b.

As illustrated by the example embodiment depicted in FIG. 2, second tunable coupler 202 can be coupled between terminals 204a and 204b of a same polarity (e.g., positive (+) or negative (−)) of second qubit 106b and third qubit 206 via capacitive couplings represented visually in FIG. 2 as capacitor 208a and capacitor 208b, respectively. Second tunable coupler 202 can comprise a tunable coupler including, but not limited to, a flux tunable coupler, a tunable coupler qubit, a flux tunable coupler qubit, a tunable qubit, a tunable bus, a flux tunable qubit bus, and/or another tunable coupler. Third qubit 206 can comprise a qubit including, but not limited to, a fixed frequency qubit, a tunable qubit, a transmon qubit, a fixed frequency transmon qubit, a tunable transmon qubit, and/or another qubit.

As illustrated by the example embodiment depicted in FIG. 2, device 200 can further comprise a second capacitor device 210 (denoted as Bypass Capacitor 2 in FIG. 2) that can be coupled to terminals 204a and 204c of an opposite polarity (e.g., positive (+) and negative (−)) of second qubit 106b and third qubit 206. As illustrated by the example embodiment depicted in FIG. 2, second capacitor device 210 can comprise a first terminal 212a and a second terminal 212b that can be cross coupled between second qubit 106b and third qubit 206, where second tunable coupler 202 can be directly coupled between second qubit 106b and third qubit 206. For example, as illustrated in FIG. 2, first terminal 212a of second capacitor device 210 can be coupled to terminal 204a of second qubit 106b and second terminal 212b of second capacitor device 210 can be coupled to terminal 204c of third qubit 206. Second capacitor device 210 can comprise a capacitor device including, but not limited to, a differential capacitor (e.g., a capacitor that connects opposite voltage paddles of a transmon qubit), a bypass capacitor, and/or another capacitor device.

In various embodiments, second tunable coupler 202 can be configured to generate and/or control a third coupling 214 (e.g., a second tunable coupling, not illustrated in FIG. 2) between second qubit 106b and third qubit 206. In various embodiments, second capacitor device 210 can be configured to generate and/or provide a fourth coupling 216 (e.g., a second capacitive coupling, not illustrated in FIG. 2) that is opposite in sign relative to third coupling 214 between second qubit 106b and third qubit 206, where third coupling 214 can be generated and/or controlled by second tunable coupler 202 as described above. In these embodiments, second capacitor device 210 can generate and/or provide fourth coupling 216 based on a resonant frequency of second tunable coupler 202 being smaller than a resonant frequency of both second qubit 106*b* and/or third qubit 206 as described below (e.g., smaller than a resonant frequency of second qubit 106*b* and smaller than a resonant frequency of third qubit 206).

In an example embodiment, although not depicted in FIG. 2, device 200, tunable coupler 102, capacitor device 110, second tunable coupler 202, and/or second capacitor device 210 can be coupled to a pulse generator device (e.g., an AWG, a VNA, etc.) that can be external to device 200 and can transmit and/or receive pulses (e.g., microwave pulses) to and/or from device 200, tunable coupler 102, capacitor device 110, second tunable coupler 202, and/or second capacitor device 210. In this example embodiment, such a pulse generator device (e.g., an AWG, a VNA, etc.) can also be coupled to a computer (e.g., computer 1012 described below with reference to FIG. 10) comprising a memory (e.g., system memory 1016 described below with reference to FIG. 10) that can store instructions thereon (e.g., software, routines, processing threads, etc.) and a processor (e.g., processing unit 1014 described below with reference to FIG. 10) that can execute such instructions that can be stored on the memory. In this example embodiment, such a computer can be employed to operate and/or control (e.g., via processing unit 1014 executing instructions stored on system memory 1014) such a pulse generator device (e.g., an AWG, a VNA, etc.), thereby enabling the pulse generator device to transmit and/or receive pulses (e.g., microwave pulses) to and/or from device 200, tunable coupler 102, capacitor device 110, second tunable coupler 202, and/or second capacitor device 210.

Continuing with the example embodiment described above, based on receiving a pulse from such a pulse generator device (e.g., via computer 1012, system memory 1014, processing unit 1014, etc.): tunable coupler 102 can provide a tunable coupling (e.g., first coupling 114) between terminals 104*a* and 104*b* of a same polarity (e.g., positive (+) or negative (−)) of first qubit 106*a* and second qubit 106*b*; and/or second tunable coupler 202 can provide a second tunable coupling (e.g., third coupling 214) between terminals 204*a* and 204*b* of a same polarity (e.g., positive (+) or negative (−)) of second qubit 106*b* and third qubit 206. In this example embodiment, based on receiving a pulse from such a pulse generator device (e.g., via computer 1012, system memory 1014, processing unit 1014, etc.): capacitor device 110 can provide a capacitive coupling (e.g., second coupling 116) between terminals 104*a* and 104*c* of opposite polarity (e.g., positive (+) and negative (−)) of first qubit 106*a* and second qubit 106*b*; and/or second capacitor device 210 can provide a second capacitive coupling (e.g., fourth coupling 216) between terminals 204*a* and 204*c* of opposite polarity (e.g., positive (+) and negative (−)) of second qubit 106*b* and third qubit 206. In this example embodiment, based on receiving a pulse from such a pulse generator device (e.g., via computer 1012, system memory 1014, processing unit 1014, etc.): tunable coupler 102 can further tune a resonant frequency associated with the tunable coupling (e.g., first coupling 114), where the capacitive coupling (e.g., second coupling 116) generates a coupling that cancels the tunable coupling when the resonant frequency associated with the tunable coupling is smaller than a resonant frequency of both first qubit 106*a* and second qubit 106*b* (e.g., smaller than a resonant frequency of first qubit 106*a* and smaller than a resonant frequency of second qubit 106*b*); and/or second tunable coupler 202 can further tune a resonant frequency associated with the second tunable coupling (e.g., third coupling 214), where the second capacitive coupling (e.g., fourth coupling 216) generates a coupling that cancels the second tunable coupling when the resonant frequency associated with the second tunable coupling is smaller than a resonant frequency of both second qubit 106*b* and third qubit 206 (e.g., smaller than a resonant frequency of second qubit 106*b* and smaller than a resonant frequency of third qubit 206).

In various embodiments, tunable coupler 102 or second tunable coupler 202 can be configured to respectively control (e.g., via computer 1012, system memory 1014, processing unit 1014, an AWG, a VNA, etc.) first coupling 114 or third coupling 214 and capacitor device 110 or second capacitor device 210 can be configured to respectively provide (e.g., via computer 1012, system memory 1014, processing unit 1014, an AWG, a VNA, etc.) second coupling 116 or fourth coupling 216 to eliminate coherent rotations and/or coherent qubit errors (e.g., ZZ errors) on first qubit 106*a*, second qubit 106*b*, third qubit 206, and/or an adjacent qubit 218 (not illustrated in FIG. 2). In these embodiments, such an adjacent qubit 218 can comprise a qubit that can be formed on device 200 at a location that is adjacent to first qubit 106*a*, second qubit 106*b*, and/or third qubit 206.

In these embodiments, based on receiving pulses (e.g., microwave pulses) from a pulse generator device (e.g., an AWG, a VNA, etc.) as described above (e.g., via computer 1012, system memory 1014, processing unit 1014, etc.) tunable coupler 102 and capacitor device 110 can decouple: first qubit 106*a* from second qubit 106*b*; and/or adjacent qubit 218 from first qubit 106*a* and/or second qubit 106*b*. In these embodiments, based on receiving such pulses from such a pulse generator device as described above, second tunable coupler 202 and second capacitor device 210 can decouple: second qubit 106*b* from third qubit 206; and/or adjacent qubit 218 from second qubit 106*b* and/or third qubit 206.

In these embodiments, based on receiving such pulses from such a pulse generator device as described above, tunable coupler 102 and capacitor device 110 can decouple first qubit 106*a* from second qubit 106*b* and/or adjacent qubit 106*c* from first qubit 106*a* and/or second qubit 106*b* based on (e.g., using) the capacitive coupling (e.g., second coupling 116) described above that can cancel the tunable coupling (e.g., first coupling 114) when the resonant frequency associated with the tunable coupling (e.g., the resonant frequency associated with tunable coupler 102) is smaller than the resonant frequency of both first qubit 106*a* and second qubit 106*b* (e.g., smaller than a resonant frequency of first qubit 106*a* and smaller than a resonant frequency of second qubit 106*b*). In these embodiments, based on receiving such pulses from such a pulse generator device as described above, second tunable coupler 202 and second capacitor device 210 can decouple second qubit 106*b* from third qubit 206 and/or adjacent qubit 218 from second qubit 106*b* and/or third qubit 206 based on (e.g., using) the second capacitive coupling (e.g., fourth coupling 216) described above that can cancel the second tunable coupling (e.g., third coupling 214) when the resonant frequency associated with the second tunable coupling (e.g., the resonant frequency associated with second tunable coupler 202) is smaller than the resonant frequency of both second qubit 106*b* and third qubit 206 (e.g., smaller than a resonant frequency of second qubit 106*b* and smaller than a resonant frequency of third qubit 206).

In these embodiments, based on such decoupling of first qubit 106*a* from second qubit 106*b*, second qubit 106*b* from third qubit 206, and/or adjacent qubit 218 from second qubit 106*b* and/or third qubit 206, tunable coupler 102 and capacitor device 110 and/or second tunable coupler 202 and second capacitor device 210 can thereby eliminate coherent rotations and/or coherent qubit errors (e.g., ZZ errors) on first qubit 106a, second qubit 106b, third qubit 206, and/or adjacent qubit 218. In these embodiments, based on such elimination of the coherent rotations and/or coherent qubit errors, device 200, tunable coupler 102, capacitor device 110, second tunable coupler 202, and/or second capacitor device 210 can thereby facilitate: reduced quantum gate errors associated with first qubit 106a, second qubit 106b, third qubit 206, and/or adjacent qubit 218; increased speed of a quantum gate comprising first qubit 106a and second qubit 106b or second qubit 106b and third qubit 206; improved performance of a quantum processor comprising device 200 (e.g., which can comprise a quantum coupler device); and/or improved fidelity of such a quantum processor comprising device 200.

In an example embodiment, during operation of device 200, to perform a quantum gate between first qubit 106a and second qubit 106b, tunable coupler 102 can be pulsed on, while second tunable coupler 202 remains in an off state. Conversely, in this example embodiment, during operation of device 200, to perform a quantum gate between second qubit 106b and third qubit 206, second tunable coupler 202 can be pulsed on, while tunable coupler 102 remains in an off state. In an example, non-limiting alternative embodiment of device 200 that can comprise more qubits (e.g., 4 or more qubits, not illustrated in the figures), each pair of qubits, between which a two qubit quantum gate can be performed, can have their own coupler qubit (e.g., tunable coupler 102 or second tunable coupler 202) and bypass capacitor (e.g., capacitor device 110 or second capacitor device 210). In this example, non-limiting alternative embodiment of device 200, one or more of the embodiments of the subject disclosure described herein (e.g., device 100, device 200, etc.) can be generalized (e.g., scaled) to accommodate a certain number of qubits (e.g., 4 or more) and/or to accommodate a various topologies (e.g., various superconducting circuit topologies).

Fabrication of the various embodiments of the subject disclosure described herein and/or illustrated in the figures (e.g., device 100, 200, etc.) can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, the various embodiments of the subject disclosure described herein and/or illustrated in the figures (e.g., device 100, 200, etc.) can be fabricated on a substrate (e.g., a silicon (Si) substrate, etc.) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

The various embodiments of the subject disclosure described herein and/or illustrated in the figures (e.g., device 100, 200, etc.) can be fabricated using various materials. For example, the various embodiments of the subject disclosure described herein and/or illustrated in the figures (e.g., device 100, 200, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

Figure 3:
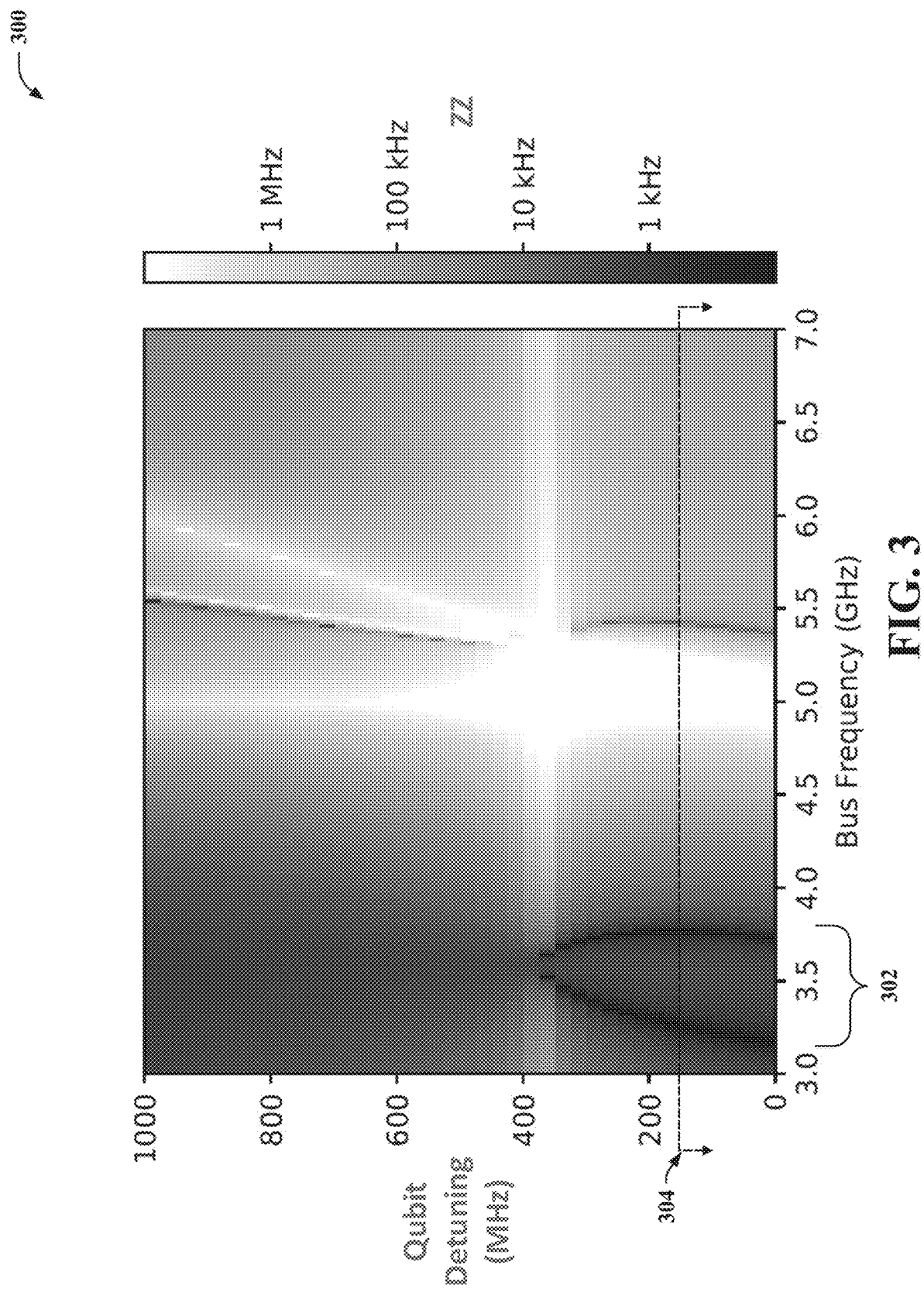
FIGS. 3 and 4 illustrate example, non-limiting graphs that can facilitate a quantum gate between qubits using a tunable coupler and a capacitor device in accordance with one or more embodiments described herein.

FIG. 3 illustrates example, non-limiting graph 300 that can facilitate a quantum gate between qubits using a tunable coupler and a capacitor device in accordance with one or more embodiments described herein. Repetitive description of like elements and/or processes employed in respective embodiments is omitted for sake of brevity.

Graph 300 can comprise results data yielded from implementing one or more embodiments of the subject disclosure described herein. For example, graph 300 can comprise results data yielded from implementing (e.g., simulating, quantizing, etc.) device 100 in accordance with one or more embodiments (e.g., computer-implemented methods 500 and/or 600 described below with reference to FIGS. 5 and 6, respectively) of the subject disclosure described herein. In this example, as illustrated in FIG. 3, graph 300 can comprise a three dimensional (3D) graph of results data yielded from implementing device 100 that can be plotted as: qubit detuning expressed in megahertz (MHz) in the Y-axis (e.g., the vertical axis of graph 300); the frequency of tunable coupler 102 (denoted as Bus Frequency in FIG. 3) in the X-axis (e.g., the horizontal axis of graph 300), where the frequency of tunable coupler 102 can be controlled by magnetic flux threading through SQUID 118 of device 100 and expressed in gigahertz (GHz); and ZZ interaction frequencies represented by varying shades of gray in the Z-axis (e.g., the axis of graph 300 extending into and out of the page) that correspond with frequencies ranging from 1 kHz to 1 MHz as illustrated by the ZZ legend depicted in FIG. 3.

In an example embodiment, to produce graph 300, device 100 can be quantized using the following parameters:

Frequency of first qubit 106a=5 GHz;

Frequency of second qubit 106b=5 GHz+detuning;

Coupling between first qubit 106a, second qubit 106b, and tunable coupler 102=60 megahertz MHz; and Direct coupling between first qubit 106a and second qubit 106b=−2 MHz.

In an example embodiment, to produce graph 300, device 100 can be quantized using the above defined parameters, where the frequency and the detuning of tunable coupler 102 can be varied. In this example embodiment, the ZZ interaction between first qubit 106a and second qubit 106b can be calculated based on such variations of the frequency and the detuning of tunable coupler 102. In this example embodiment, as illustrated by graph 300 depicted in FIG. 3, a region 302 near tunable coupler 102 frequency=3.5 GHz is where ZZ interactions are relatively small, which can represent the operating point where tunable coupler 102 is off. In this example embodiment, to form a two qubit gate between first qubit 106a and second qubit 106b, the frequency of tunable coupler 102 can be increased to a relatively large value (e.g., 5 GHz). For instance, in this example embodiment, the frequency of tunable coupler 102 can be controlled (e.g., increased, decreased, etc.) by applying a magnetic flux threading through SQUID 118 (e.g., by providing a pulse via computer 1012, system memory 1014, processing unit 1014, an AWG, a VNA, etc. as described above with reference to FIG. 1).

An example, non-limiting alternative embodiment of graph 300 can comprise a two-dimensional representation of a plane extending through graph 300, where such a plane can be defined along line 304 depicted in FIG. 3. For instance, graph 400 described below and illustrated in FIG. 4 can comprise such an example, non-limiting alternative embodiment of graph 300, where graph 400 can comprise a two-dimensional side view of such a plane extending through graph 300 that can be defined along line 304 depicted in FIG. 3.

Figure 4:
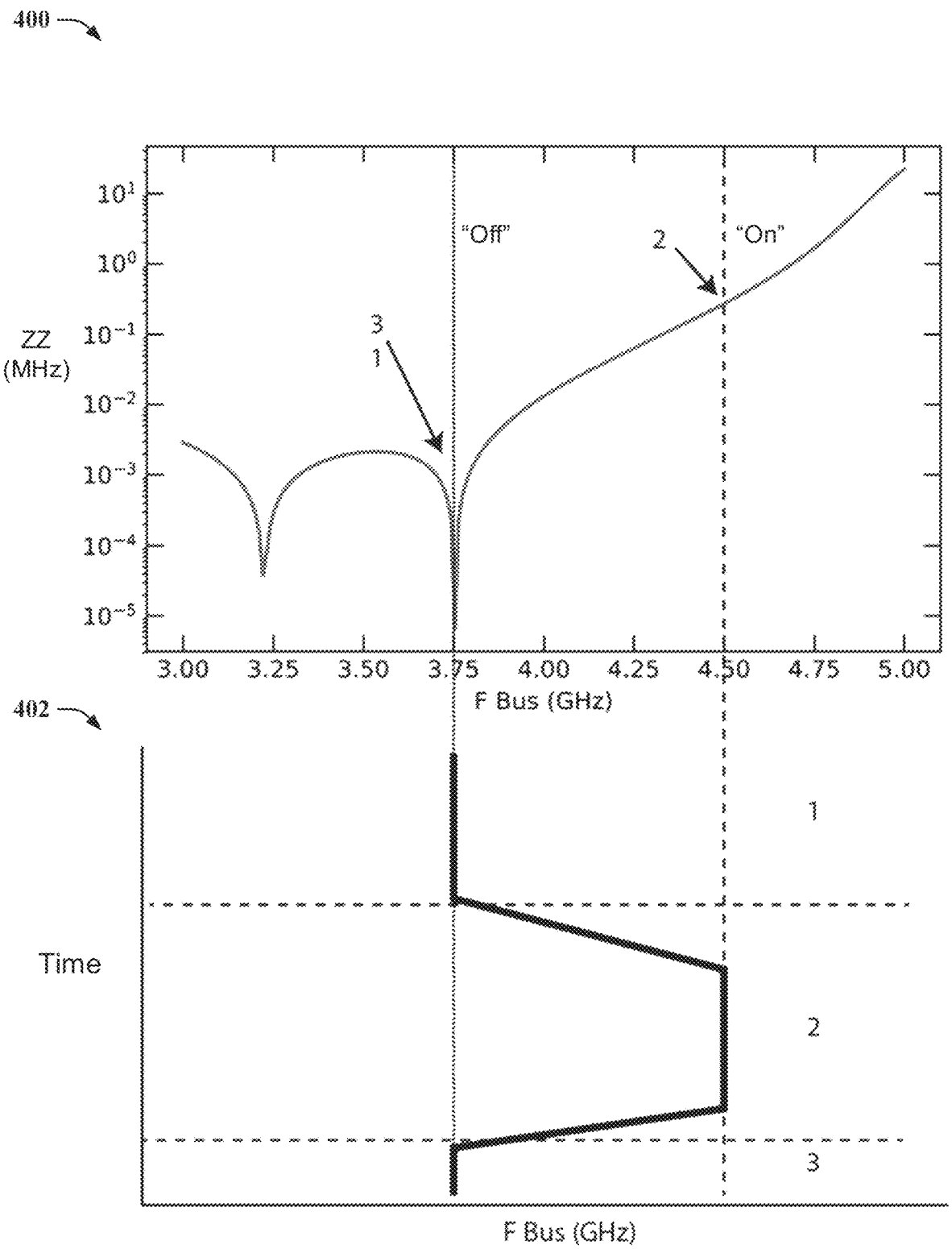

FIG. 4 illustrates example, non-limiting information 400 that can facilitate a quantum gate between qubits using a tunable coupler and a capacitor device in accordance with one or more embodiments described herein. Repetitive description of like elements and/or processes employed in respective embodiments is omitted for sake of brevity.

As described above, graph 400 can comprise an example, non-limiting alternative embodiment of graph 300, where graph 400 can comprise a two-dimensional side view of a plane extending through graph 300 that can be defined along line 304 depicted in FIG. 3. As illustrated in the example embodiment depicted in FIG. 4, graph 400 shows the ZZ interaction strength between first qubit 106a and second qubit 106b for a given set of device parameters (e.g., the device parameters defined above with reference to FIG. 3). In this example embodiment, such ZZ interaction strength values are plotted in the Y-axis (e.g., vertical axis) of graph 400 and correspond to various flux pulse values (denoted as F Bus (GHz)) of tunable coupler 102 plotted along the X-axis (e.g., horizontal axis) of graph 400. In the example embodiment depicted in FIG. 4, graph 400 can have a corresponding time graph 402 illustrating the duration of each flux pulse that can be applied to device 100 (e.g., tunable coupler 102, capacitor device 110, etc.) when implementing the quantum gate sequence described below.

Quantum Gate Sequence

As described above with reference to FIG. 3, device 100 can be implemented (e.g., quantized, simulated, etc.) by providing a pulse to tunable coupler 102 that can turn ZZ interaction on and off and results data obtained from such implementation can be plotted as graph 300, graph 400, and/or time graph 402 depicted in FIGS. 3 and 4. In the example embodiment of graph 400 and time graph 402 illustrated in FIG. 4, the first step of a quantum gate sequence (e.g., between first qubit 106a and second qubit 106b) is denoted by the numeral 1 in graph 400 and time graph 402. In this example embodiment, at step 1 of such a quantum gate sequence, the frequency (e.g., resonant frequency) of tunable coupler 102 (e.g., which can comprise a tunable bus) can be set such that the ZZ interaction is negligible (e.g., with a flux pulse of 3.75 GHz, the corresponding ZZ interaction strength is approximately $10^{-5}$ MHz). In this example embodiment, the second step of such a quantum gate sequence is denoted by the numeral 2 in graph 400 and time graph 402. In this example embodiment, at step 2 of such a quantum gate sequence, the frequency (e.g., resonant frequency) of tunable coupler 102 can be tuned with a flux pulse (e.g., 4.50 GHz) in order to turn on the ZZ interaction between first qubit 106a and second qubit 106b. In this example embodiment, the third step of such a quantum gate sequence is denoted by the numeral 3 in graph 400 and time graph 402. In this example embodiment, at step 3 of such a quantum gate sequence, after the flux pulse finishes, the frequency (e.g., resonant frequency) of tunable coupler 102 is returned to the off position and the ZZ interaction between first qubit 106a and second qubit 106b is again negligible.

The various embodiments of the subject disclosure described herein (e.g., device 100, device 200, etc.) can be associated with various technologies. For example, the various embodiments of the subject disclosure described herein (e.g., device 100, device 200, etc.) can be associated with quantum computing technologies, quantum gate technologies, quantum coupler technologies, quantum hardware and/or software technologies, quantum circuit technologies, superconducting circuit technologies, machine learning technologies, artificial intelligence technologies, cloud computing technologies, and/or other technologies.

The various embodiments of the subject disclosure described herein (e.g., device 100, device 200, etc.) can provide technical improvements to systems, devices, components, operational steps, and/or processing steps associated with the various technologies identified above. For example, the various embodiments of the subject disclosure described herein (e.g., device 100, device 200, etc.) can provide a tunable coupling between terminals of a same polarity of a first qubit (e.g., first qubit 106a) and a second qubit (e.g., second qubit 106b); provide a capacitive coupling between terminals of opposite polarity of the first qubit and the second qubit; and/or tune a resonant frequency associated with the tunable coupling, where the capacitive coupling generates a coupling that cancels the tunable coupling when the resonant frequency associated with the tunable coupling is smaller than a resonant frequency of both the first qubit and the second qubit. In this example, based on such cancelation (e.g., zero out, offset, negate, etc.) of the tunable coupling, the various embodiments of the subject disclosure described herein (e.g., device 100, device 200, etc.) can thereby eliminate coherent rotations and/or coherent qubit errors on the first qubit, the second qubit, and/or an adjacent qubit (e.g., adjacent qubit 106c) that cause gate errors during quantum computations. In this example, based on such elimination of coherent rotations and/or coherent qubit errors on the first qubit, the second qubit, and/or the adjacent qubit, the various embodiments of the subject disclosure described herein (e.g., device 100, device 200, etc.) can thereby facilitate: reduced quantum gate errors associated with the first qubit, the second qubit, and/or the adjacent qubit; increased speed of a quantum gate comprising the first qubit and the second qubit; improved performance of a quantum processor (e.g., a quantum processor comprising device 100 or device 200); and/or improved fidelity of the quantum processor.

The various embodiments of the subject disclosure described herein (e.g., device 100, device 200, etc.) can provide technical improvements to a processing unit (e.g., a quantum processor comprising device 100 or device 200, processing unit 1014, etc.) associated with a classical computing device and/or a quantum computing device (e.g., a quantum processor, quantum hardware, superconducting circuit, etc.) that can be associated with one or more of the various embodiments of the subject disclosure described herein (e.g., device 100, device 200, etc.). For example, by cancelling (e.g., zero out, offset, negate, etc.) the tunable coupling and eliminating coherent rotations and/or coherent qubit errors on the first qubit, the second qubit, and/or the adjacent qubit as described above, one or more of the various embodiments of the subject disclosure described herein (e.g., device 100, device 200, etc.) can thereby facilitate: reduced quantum gate errors associated with the first qubit, the second qubit, and/or the adjacent qubit; and/or increased speed of a quantum gate comprising the first qubit and the second qubit. In this example, by reducing such quantum gate errors and/or increasing the speed of such a quantum gate, one or more of the various embodiments of the subject disclosure described herein (e.g., device 100, device 200, etc.) can facilitate: improved performance of a quantum processor (e.g., a quantum processor comprising device 100 or device 200 and that executes the quantum gate); and/or improved fidelity of such a quantum processor.

Based on such cancelation of the tunable coupling and elimination of coherent rotations and/or coherent qubit errors on the first qubit, the second qubit, and/or the adjacent qubit as described above, a practical application of the various embodiments of the subject disclosure described herein (e.g., device 100, device 200, etc.) is that they can be implemented in a quantum device (e.g., a quantum processor, a quantum computer, etc.) to more quickly and more efficiently compute, with improved fidelity, one or more solutions (e.g., heuristic(s), etc.) to a variety of problems ranging in complexity (e.g., an estimation problem, an optimization problem, etc.) in a variety of domains (e.g., finance, chemistry, medicine, etc.). For example, based on such cancelation of the tunable coupling and elimination of coherent rotations and/or coherent qubit errors on the first qubit, the second qubit, and/or the adjacent qubit as described above, a practical application of one or more of the various embodiments of the subject disclosure described herein (e.g., device 100, device 200, etc.) is that they can be implemented in, for instance, a quantum processor (e.g., a quantum processor comprising device 100 or device 200) to compute one or more solutions (e.g., heuristic(s), etc.) to an optimization problem in the domain of chemistry, medicine, and/or finance, where such a solution can be used to engineer, for instance, a new chemical compound, a new medication, and/or a new options pricing system and/or method.

It should be appreciated that the various embodiments of the subject disclosure described herein (e.g., device 100, device 200, etc.) provide a new approach driven by relatively new quantum computing technologies. For example, the various embodiments of the subject disclosure described herein (e.g., device 100, device 200, etc.) provide a new approach to eliminate unintentional coherent rotations and/or coherent qubit errors that occur on spectator qubits (e.g., first qubit 106a, second qubit 106b, and/or adjacent qubit 106c) that result in gate errors during quantum computations. In this example, such a new approach to eliminate such unintentional coherent rotations and/or coherent qubit errors can enable faster and more efficient quantum computations with improved fidelity using a quantum processor comprising one or more of the various embodiments of the subject disclosure described herein (e.g., device 100, device 200, etc.).

The various embodiments of the subject disclosure described herein (e.g., device 100, device 200, etc.) can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, etc.) to execute defined tasks related to the various technologies identified above. The various embodiments of the subject disclosure described herein (e.g., device 100, device 200, etc.) can be employed to solve new problems that arise through advancements in technologies mentioned above, employment of quantum computing systems, cloud computing systems, computer architecture, and/or another technology.

It is to be appreciated that the various embodiments of the subject disclosure described herein (e.g., device 100, device 200, etc.) can utilize various combinations of electrical components, mechanical components, and circuitry that cannot be replicated in the mind of a human or performed by a human, as the various operations that can be executed by the various embodiments of the subject disclosure described herein (e.g., device 100, device 200, etc.) are operations that are greater than the capability of a human mind. For instance, the amount of data processed, the speed of processing such data, or the types of data processed by the various embodiments of the subject disclosure described herein (e.g., device 100, device 200, etc.) over a certain period of time can be greater, faster, or different than the amount, speed, or data type that can be processed by a human mind over the same period of time.

According to several embodiments, the various embodiments of the subject disclosure described herein (e.g., device 100, device 200, etc.) can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that the various embodiments of the subject disclosure described herein (e.g., device 100, device 200, etc.) can include information that is impossible to obtain manually by an entity, such as a human user. For example, the type, amount, and/or variety of information included in device 100 and/or device 200 can be more complex than information obtained manually by a human user.

Figure 5:
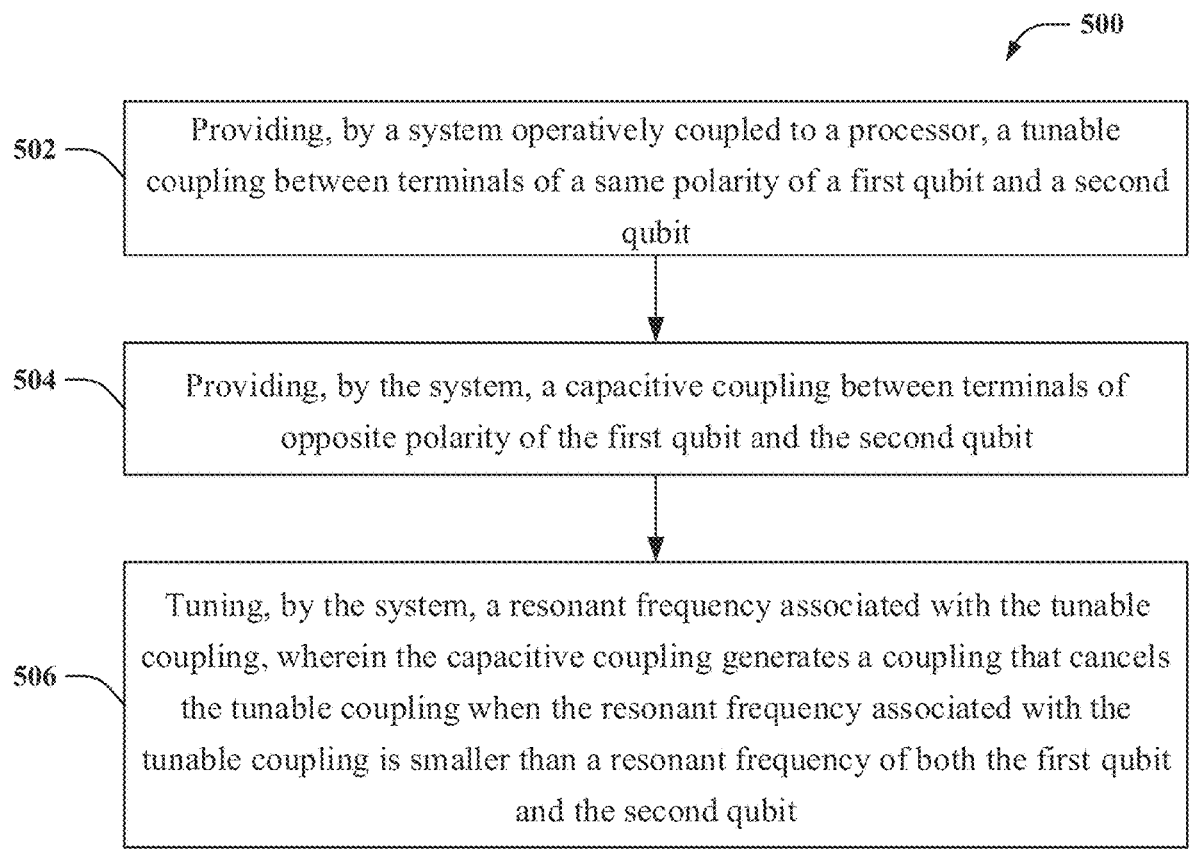
FIGS. 5, 6, 7, 8, and 9 illustrate flow diagrams of example, non-limiting computer-implemented methods that can facilitate a quantum gate between qubits using a tunable coupler and a capacitor device in accordance with one or more embodiments described herein.

FIG. 5 illustrates a flow diagram of an example, non-limiting computer-implemented method 500 that can facilitate a quantum gate between qubits using a tunable coupler and a capacitor device in accordance with one or more embodiments described herein. Repetitive description of like elements and/or processes employed in respective embodiments is omitted for sake of brevity.

At 502, computer-implemented method 500 can comprise providing, by a system (e.g., a system comprising computer 1012 coupled to an AWG and/or a VNA that can be further coupled to device 100, tunable coupler 102, and/or capacitor device 110) operatively coupled to a processor (e.g., processing unit 1014, etc.), a tunable coupling (e.g., first coupling 114) between terminals (e.g., terminals 104a and 104b) of a same polarity (e.g., positive (+) or negative (−)) of a first qubit and a second qubit (e.g., first qubit 106a and second qubit 106b).

At 504, computer-implemented method 500 can comprise providing, by the system (e.g., computer 1012 coupled to an AWG and/or a VNA and further coupled to device 100, tunable coupler 102, and/or capacitor device 110), a capacitive coupling (e.g., second coupling 116) between terminals (e.g., terminals 104a and 104c) of opposite polarity (e.g., positive (+) and negative (−)) of the first qubit and the second qubit.

At 506, computer-implemented method 500 can comprise tuning, by the system (e.g., computer 1012 coupled to an AWG and/or a VNA and further coupled to device 100, tunable coupler 102, and/or capacitor device 110), a resonant frequency associated with the tunable coupling, where the capacitive coupling generates a coupling that cancels the tunable coupling when the resonant frequency associated with the tunable coupling is smaller than a resonant frequency of both the first qubit and the second qubit (e.g., smaller than a resonant frequency of first qubit 106a and smaller than a resonant frequency of second qubit 106b).

Figure 6:
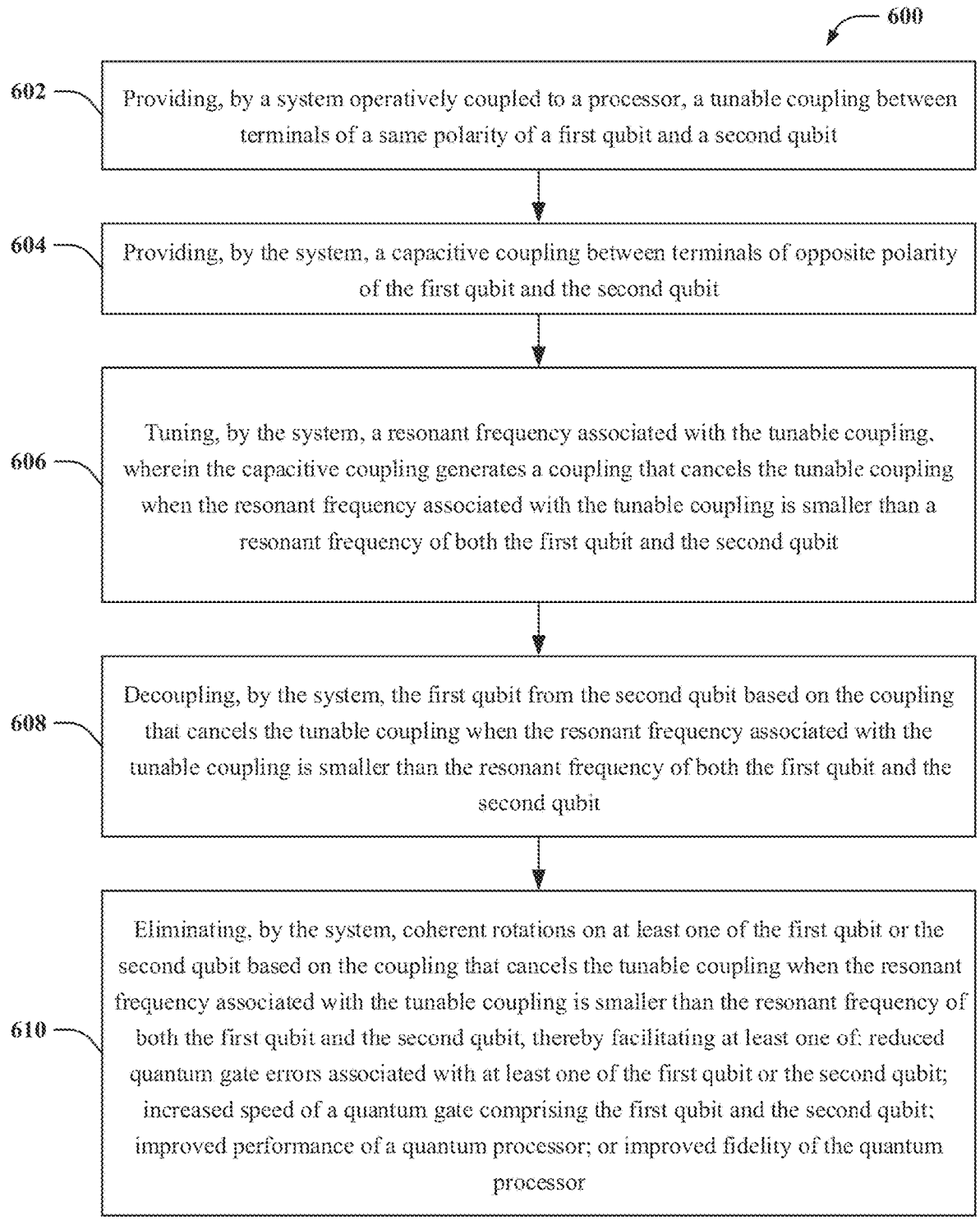

FIG. 6 illustrates a flow diagram of an example, non-limiting computer-implemented method 600 that can facilitate a quantum gate between qubits using a tunable coupler and a capacitor device in accordance with one or more embodiments described herein. Repetitive description of like elements and/or processes employed in respective embodiments is omitted for sake of brevity.

At 602, computer-implemented method 600 can comprise providing, by a system (e.g., a system comprising computer 1012 coupled to an AWG and/or a VNA that can be further coupled to device 100, tunable coupler 102, and/or capacitor device 110) operatively coupled to a processor (e.g., processing unit 1014, etc.), a tunable coupling (e.g., first coupling 114) between terminals (e.g., terminals 104a and 104b) of a same polarity (e.g., positive (+) or negative (−)) of a first qubit and a second qubit (e.g., first qubit 106a and second qubit 106b).

At 604, computer-implemented method 600 can comprise providing, by the system (e.g., computer 1012 coupled to an AWG and/or a VNA and further coupled to device 100, tunable coupler 102, and/or capacitor device 110), a capacitive coupling (e.g., second coupling 116) between terminals (e.g., terminals 104a and 104c) of opposite polarity (e.g., positive (+) and negative (−)) of the first qubit and the second qubit.

At 606, computer-implemented method 600 can comprise tuning, by the system (e.g., computer 1012 coupled to an AWG and/or a VNA and further coupled to device 100, tunable coupler 102, and/or capacitor device 110), a resonant frequency associated with the tunable coupling, where the capacitive coupling generates a coupling that cancels the tunable coupling when the resonant frequency associated with the tunable coupling is smaller than a resonant frequency of both the first qubit and the second qubit (e.g., smaller than a resonant frequency of first qubit 106a and smaller than a resonant frequency of second qubit 106b).

At 608, computer-implemented method 600 can comprise decoupling, by the system (e.g., computer 1012 coupled to an AWG and/or a VNA and further coupled to device 100, tunable coupler 102, and/or capacitor device 110), the first qubit from the second qubit based on the coupling that cancels the tunable coupling when the resonant frequency associated with the tunable coupling is smaller than the resonant frequency of both the first qubit and the second qubit (e.g., smaller than a resonant frequency of first qubit 106a and smaller than a resonant frequency of second qubit 106b).

At 610, computer-implemented method 600 can comprise eliminating, by the system (e.g., computer 1012 coupled to an AWG and/or a VNA and further coupled to device 100, tunable coupler 102, and/or capacitor device 110), coherent rotations on at least one of the first qubit or the second qubit based on the coupling that cancels the tunable coupling when the resonant frequency associated with the tunable coupling is smaller than the resonant frequency of both the first qubit and the second qubit, thereby facilitating at least one of: reduced quantum gate errors associated with at least one of the first qubit or the second qubit; increased speed of a quantum gate comprising the first qubit and the second qubit; improved performance of a quantum processor (e.g., a quantum processor comprising device 100, which can comprise a quantum coupler device); or improved fidelity of the quantum processor.

Figure 7:
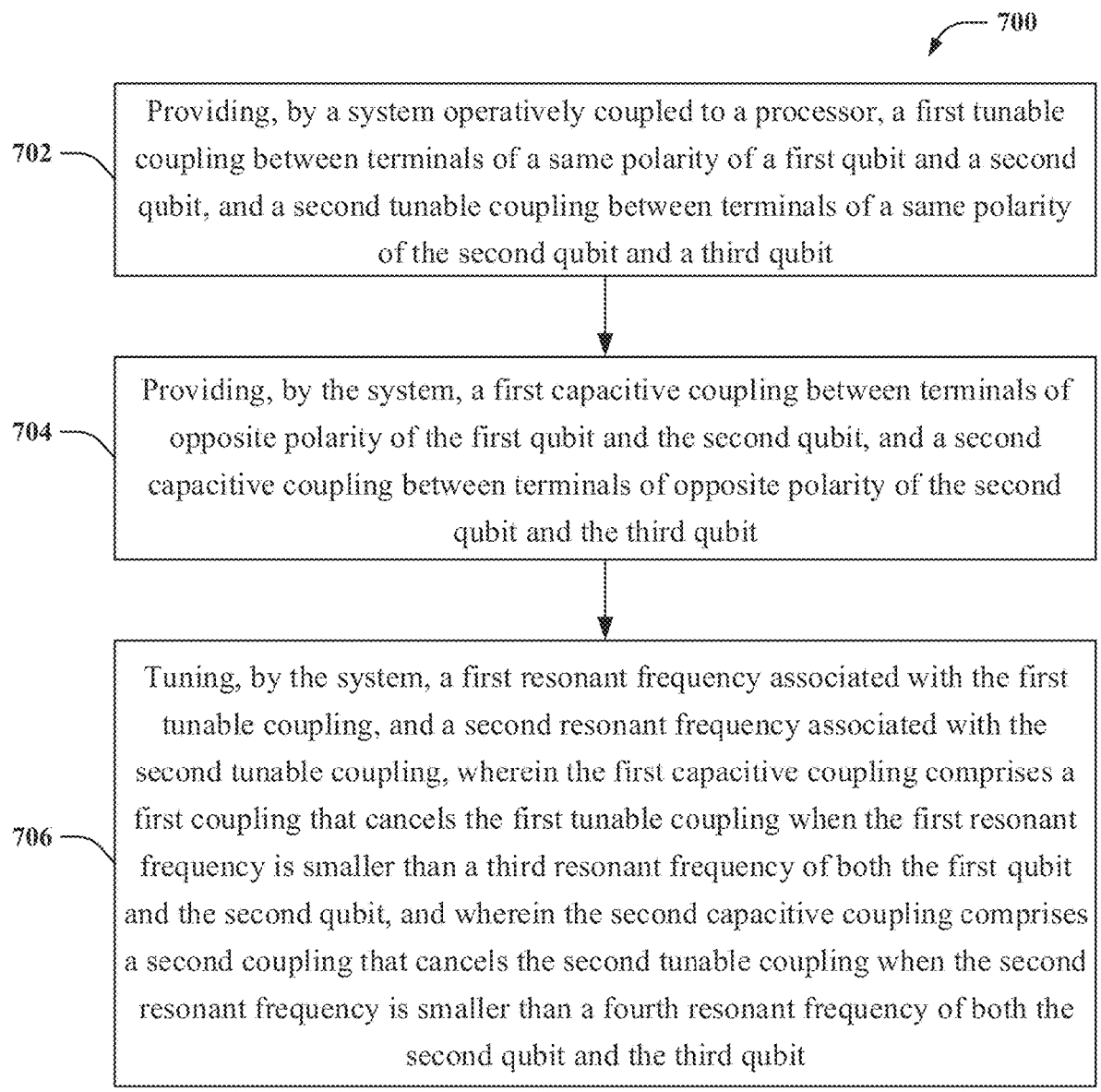

FIG. 7 illustrates a flow diagram of an example, non-limiting computer-implemented method 700 that can facilitate a quantum gate between qubits using a tunable coupler and a capacitor device in accordance with one or more embodiments described herein. Repetitive description of like elements and/or processes employed in respective embodiments is omitted for sake of brevity.

At 702, computer-implemented method 700 can comprise providing, by a system (e.g., a system comprising computer 1012 coupled to an AWG and/or a VNA that can be further coupled to device 100, tunable coupler 102, and/or capacitor device 110) operatively coupled to a processor (e.g., processing unit 1014), a first tunable coupling (e.g., first coupling 114) between terminals (e.g., terminals 104a and 104b) of a same polarity (e.g., positive (+) or negative (−)) of a first qubit and a second qubit (e.g., first qubit 106a and second qubit 106b), and a second tunable coupling (e.g., third coupling 214) between terminals (e.g., terminals 204a and 204b) of a same polarity (e.g., positive (+) or negative (−)) of the second qubit and a third qubit (e.g., third qubit 206).

At 704, computer-implemented method 700 can comprise providing, by the system (e.g., computer 1012 coupled to an AWG and/or a VNA and further coupled to device 100, tunable coupler 102, and/or capacitor device 110), a first capacitive coupling (e.g., second coupling 116) between terminals (e.g., terminals 104a and 104c) of opposite polarity (e.g., positive (+) and negative (−)) of the first qubit and the second qubit, and a second capacitive coupling (e.g., fourth coupling 216) between terminals (e.g., terminals 204a and 204c) of opposite polarity (e.g., positive (+) and negative (−)) of the second qubit and the third qubit.

At 706, computer-implemented method 700 can comprise tuning, by the system (e.g., computer 1012 coupled to an AWG and/or a VNA and further coupled to device 100, tunable coupler 102, and/or capacitor device 110), a first resonant frequency associated with the first tunable coupling, and a second resonant frequency associated with the second tunable coupling, wherein the first capacitive coupling comprises a first coupling that cancels the first tunable coupling when the first resonant frequency is smaller than a third resonant frequency of both the first qubit and the second qubit (e.g., smaller than a resonant frequency of first qubit 106a and smaller than a resonant frequency of second qubit 106b), and wherein the second capacitive coupling comprises a second coupling that cancels the second tunable coupling when the second resonant frequency is smaller than a fourth resonant frequency of both the second qubit and the third qubit (e.g., smaller than a resonant frequency of second qubit 106b and smaller than a resonant frequency of third qubit 206).

Figure 8:
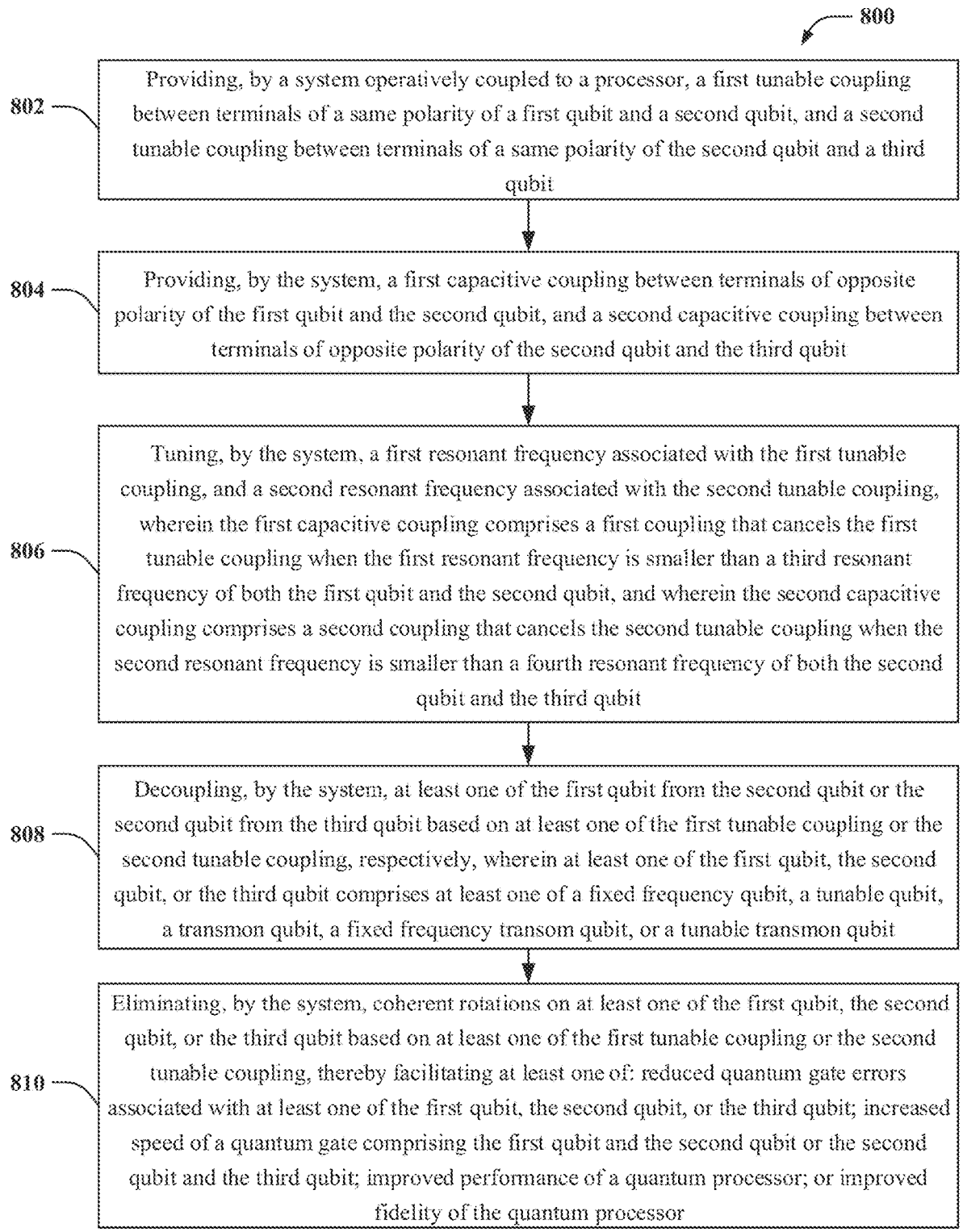

FIG. 8 illustrates a flow diagram of an example, non-limiting computer-implemented method 800 that can facilitate a quantum gate between qubits using a tunable coupler and a capacitor device in accordance with one or more embodiments described herein. Repetitive description of like elements and/or processes employed in respective embodiments is omitted for sake of brevity.

At 802, computer-implemented method 800 can comprise providing, by a system (e.g., a system comprising computer 1012 coupled to an AWG and/or a VNA that can be further coupled to device 100, tunable coupler 102, and/or capacitor device 110) operatively coupled to a processor (e.g., processing unit 1014), a first tunable coupling (e.g., first coupling 114) between terminals (e.g., terminals 104a and 104b) of a same polarity (e.g., positive (+) or negative (−)) of a first qubit and a second qubit (e.g., first qubit 106a and second qubit 106b), and a second tunable coupling (e.g., third coupling 214) between terminals (e.g., terminals 204a and 204b) of a same polarity (e.g., positive (+) or negative (−)) of the second qubit and a third qubit (e.g., third qubit 206).

At 804, computer-implemented method 800 can comprise providing, by the system (e.g., computer 1012 coupled to an AWG and/or a VNA and further coupled to device 100, tunable coupler 102, and/or capacitor device 110), a first capacitive coupling (e.g., second coupling 116) between terminals (e.g., terminals 104a and 104c) of opposite polarity (e.g., positive (+) and negative (−)) of the first qubit and the second qubit, and a second capacitive coupling (e.g., fourth coupling 216) between terminals (e.g., terminals 204a and 204c) of opposite polarity (e.g., positive (+) and negative (−)) of the second qubit and the third qubit.

At 806, computer-implemented method 800 can comprise tuning, by the system (e.g., computer 1012 coupled to an AWG and/or a VNA and further coupled to device 100, tunable coupler 102, and/or capacitor device 110), a first resonant frequency associated with the first tunable coupling, and a second resonant frequency associated with the second tunable coupling, wherein the first capacitive coupling comprises a first coupling that cancels the first tunable coupling when the first resonant frequency is smaller than a third resonant frequency of both the first qubit and the second qubit (e.g., smaller than a resonant frequency of first qubit 106a and smaller than a resonant frequency of second qubit 106b), and wherein the second capacitive coupling comprises a second coupling that cancels the second tunable coupling when the second resonant frequency is smaller than a fourth resonant frequency of both the second qubit and the third qubit (e.g., smaller than a resonant frequency of second qubit 106b and smaller than a resonant frequency of third qubit 206).

At 808, computer-implemented method 800 can comprise decoupling, by the system (e.g., computer 1012 coupled to an AWG and/or a VNA and further coupled to device 100, tunable coupler 102, and/or capacitor device 110), at least one of the first qubit from the second qubit or the second qubit from the third qubit based on at least one of the first tunable coupling or the second tunable coupling, respectively, where at least one of the first qubit, the second qubit, or the third qubit comprises at least one of a fixed frequency qubit, a tunable qubit, a transmon qubit, a fixed frequency transmon qubit, or a tunable transmon qubit.

At 810, computer-implemented method 800 can comprise eliminating, by the system (e.g., computer 1012 coupled to an AWG and/or a VNA and further coupled to device 100, tunable coupler 102, and/or capacitor device 110), coherent rotations on at least one of the first qubit, the second qubit, or the third qubit based on at least one of the first tunable coupling or the second tunable coupling, thereby facilitating at least one of: reduced quantum gate errors associated with at least one of the first qubit, the second qubit, or the third qubit; increased speed of a quantum gate comprising the first qubit and the second qubit or the second qubit and the third qubit; improved performance of a quantum processor (e.g., a quantum processor comprising device 200, which can comprise a quantum coupler device); or improved fidelity of the quantum processor.

Figure 9:
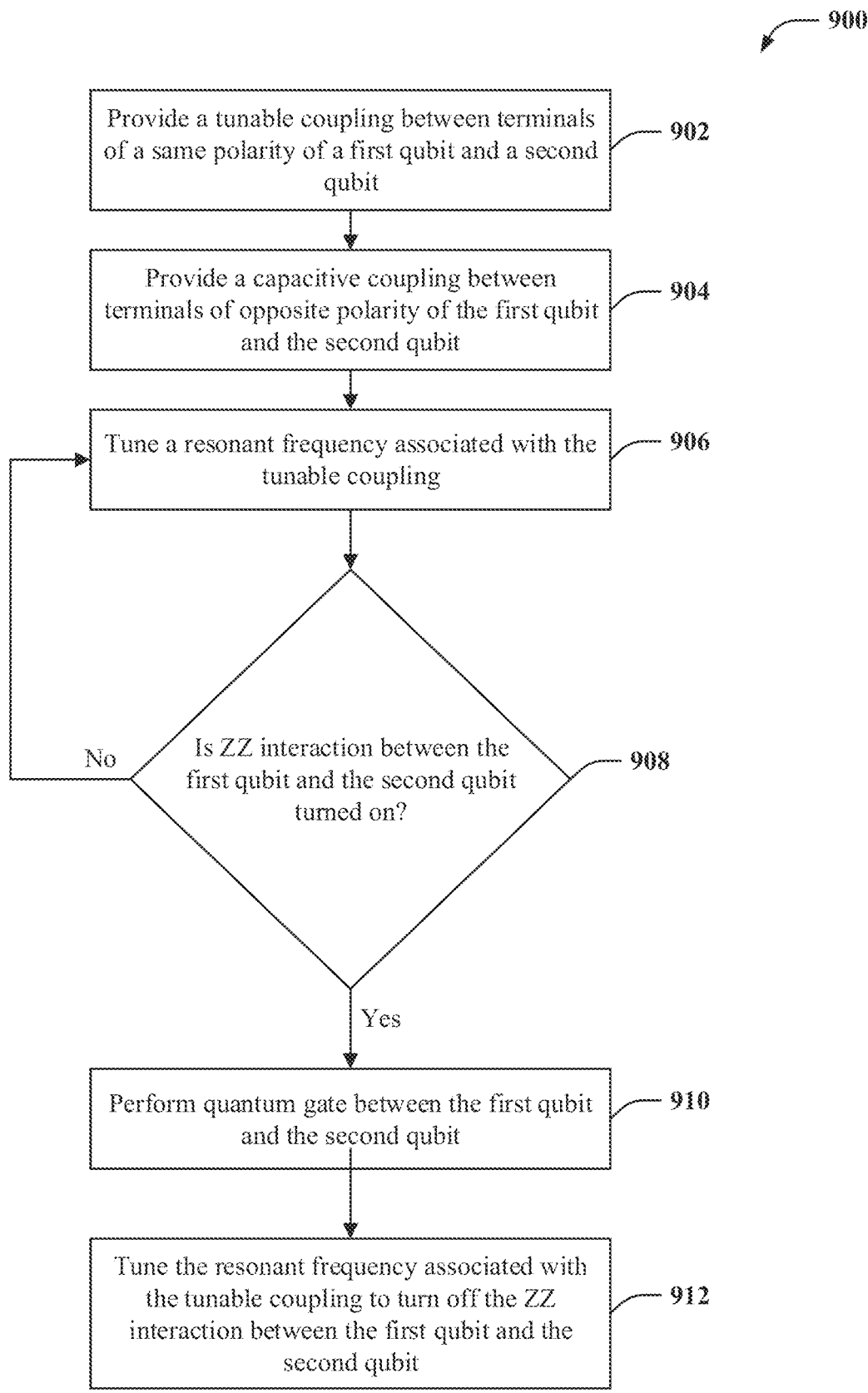

FIG. 9 illustrates a flow diagram of an example, non-limiting computer-implemented method 900 that can facilitate a quantum gate between qubits using a tunable coupler and a capacitor device in accordance with one or more embodiments described herein. Repetitive description of like elements and/or processes employed in respective embodiments is omitted for sake of brevity.

At 902, computer-implemented method 900 can comprise providing (e.g., via a system comprising computer 1012 coupled to an AWG and/or a VNA that can be further coupled to device 100, tunable coupler 102, and/or capacitor device 110) a tunable coupling (e.g., first coupling 114) between terminals (e.g., terminals 104a and 104b) of a same polarity (e.g., positive (+) or negative (−)) of a first qubit and a second qubit (e.g., first qubit 106a and second qubit 106b).

At 904, computer-implemented method 900 can comprise providing (e.g., via a system comprising computer 1012 coupled to an AWG and/or a VNA that can be further coupled to device 100, tunable coupler 102, and/or capacitor device 110) a capacitive coupling (e.g., second coupling 116) between terminals (e.g., terminals 104a and 104c) of opposite polarity (e.g., positive (+) and negative (−)) of the first qubit and the second qubit.

At 906, computer-implemented method 900 can comprise tuning (e.g., via a system comprising computer 1012 coupled to an AWG and/or a VNA that can be further coupled to device 100, tunable coupler 102, and/or capacitor device 110) a resonant frequency associated with the tunable coupling (e.g., a resonant frequency associated with first coupling 114 that can be generated and/or controlled by tunable coupler 102). For instance, with reference to the example embodiments described above and illustrated in FIGS. 1, 3, and 4, a magnetic flux can be provided (e.g., via a system comprising computer 1012 coupled to an AWG and/or a VNA that can be further coupled to device 100, tunable coupler 102, and/or capacitor device 110) to tunable coupler 102 that can enable tuning of the resonant frequency of tunable coupler 102 such that it is above, at, or below the resonant frequency of both first qubit 106a and second qubit 106b (e.g., above, at, or below a resonant frequency of first qubit 106a and above, at, or below a resonant frequency of second qubit 106b).

At 908, computer-implemented method 900 can comprise determining (e.g., via a system comprising computer 1012 coupled to an AWG and/or a VNA that can be further coupled to device 100, tunable coupler 102, and/or capacitor device 110) whether the ZZ interaction between the first qubit and the second qubit is turned on. For instance, with reference to the example embodiments described above and illustrated in FIGS. 1, 3, and 4, whether the resonant frequency associated with tunable coupler 102 is above or below the resonant frequency of both first qubit 106a and second qubit 106b can correspond with the strength of the ZZ interaction between first qubit 106a and second qubit 106b (e.g., above—corresponds with ZZ turned on; below—corresponds with ZZ turned off). Consequently, in these example embodiments, a determination as to whether the ZZ interaction is turned on can be performed using graph 300, graph 400, and/or time graph 402. In these example embodiments, when the resonant frequency of tunable coupler 102 is above the resonant frequency of both first qubit 106a and second qubit 106b (e.g., above a resonant frequency of first qubit 106a and above a resonant frequency of second qubit 106b), the capacitive coupling (e.g., second coupling 116) does not cancel (e.g., does not zero out, negate, offset, etc.) the tunable coupling (e.g., first coupling 114) and the ZZ interaction between the first qubit 106a and second qubit 106b can be increased by applying increasing flux pulse to a point where a quantum gate can be performed between first qubit 106a and second qubit 106b (e.g., as illustrated by graph 400 in FIG. 4, at a flux pulse of 4.50 GHz, the corresponding ZZ interaction strength is approximately $10^{-0.05}$ MHz).

If it is determined at 908 that the ZZ interaction between the first qubit and the second qubit is turned on, at 910, computer-implemented method 900 can comprise performing (e.g., via a system comprising computer 1012 coupled to an AWG and/or a VNA that can be further coupled to device 100, tunable coupler 102, and/or capacitor device 110) a quantum gate between the first qubit and the second qubit. For instance, with reference to the example embodiments described above and illustrated in FIGS. 1, 3, and 4, when the resonant frequency of tunable coupler 102 is tuned to a point above the resonant frequency of both first qubit 106a and second qubit 106b (e.g., above a resonant frequency of first qubit 106a and above a resonant frequency of second qubit 106b, for example, as illustrated by graph 400 in FIG. 4, at a flux pulse of 4.50 GHz) the corresponding strength of the ZZ interaction between the first qubit 106a and second qubit 106b can enable performance of a quantum gate between first qubit 106a and second qubit 106b.

At 912, computer-implemented method 900 can comprise tuning (e.g., via a system comprising computer 1012 coupled to an AWG and/or a VNA that can be further coupled to device 100, tunable coupler 102, and/or capacitor device 110) the resonant frequency associated with the tunable coupling to turn off the ZZ interaction between the first qubit and the second qubit. For instance, in the example embodiments described above and illustrated in FIGS. 1, 3, and 4, when the resonant frequency of tunable coupler 102 is below the resonant frequency of both first qubit 106a and second qubit 106b (e.g., below a resonant frequency of first qubit 106a and below a resonant frequency of second qubit 106b), the capacitive coupling (e.g., second coupling 116) can cancel (e.g., zero out, negate, offset, etc.) the tunable coupling (e.g., first coupling 114), at which point, the ZZ interaction between the first qubit 106a and second qubit 106b is negligible, and therefore, effectively turned off (e.g., as illustrated by graph 400 in FIG. 4, at a flux pulse of 3.75 GHz, the corresponding ZZ interaction strength is approximately $10^{-5}$ MHz).

If it is determined at 908 that the ZZ interaction between the first qubit and the second qubit is not turned on, computer-implemented method 900 can comprise returning to operation 906 to tune the resonant frequency associated with the tunable coupling. In various embodiments, operations 906 and 908 of computer-implemented method 900 can be repeated until the ZZ interaction between the first qubit and the second qubit is turned on. In these embodiments, based on repeating operations 906 and 908 until the ZZ interaction between the first qubit and the second qubit is turned on, computer-implemented method 900 can proceed to operations 910 and 912.

Figure 10:
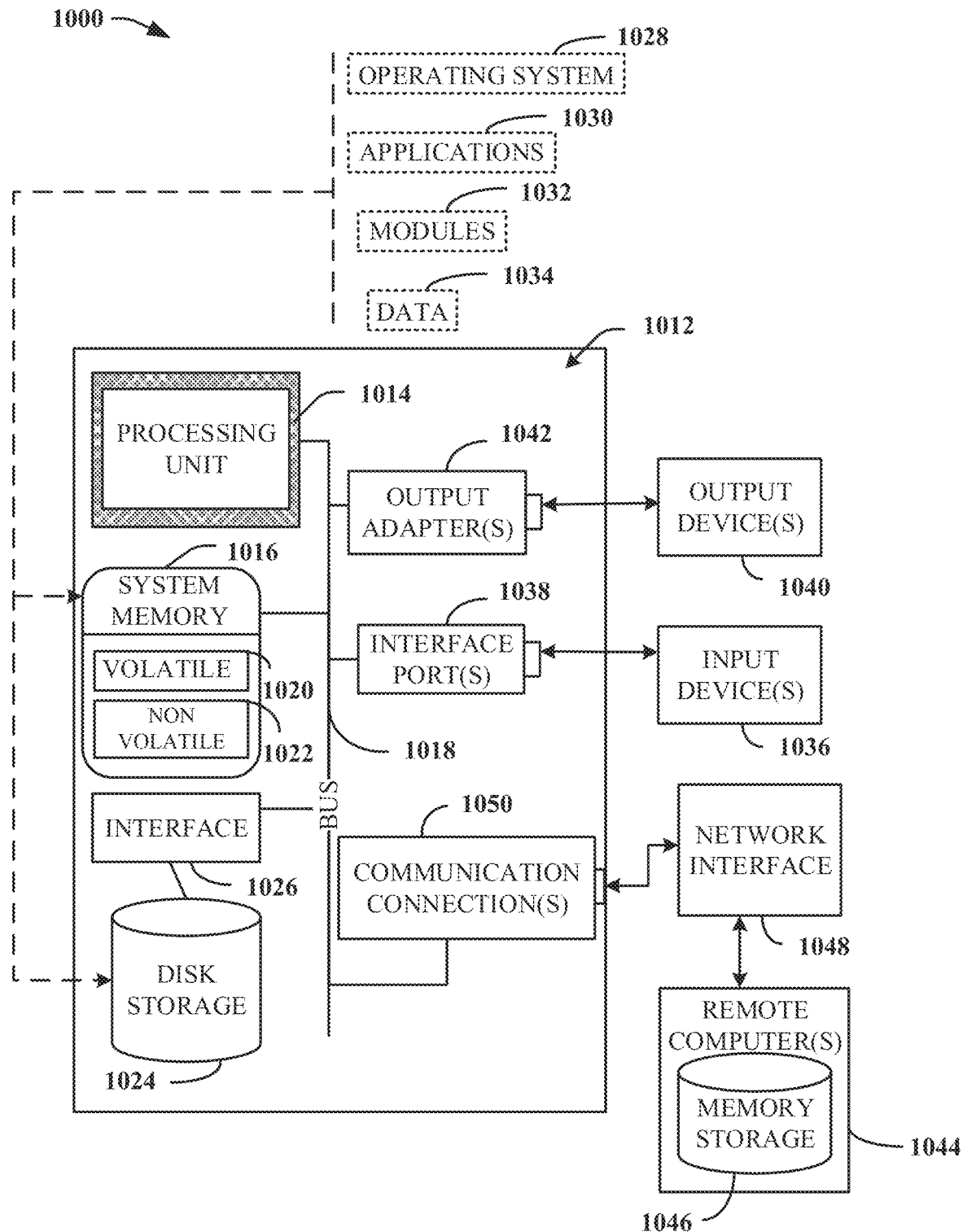
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. For example, as described below, operating environment 1000 can be used to implement the example, non-limiting multi-step fabrication sequences described above with reference to FIGS. 1 and 2 that can be implemented to fabricate device 100 and/or device 200 in accordance with one or more embodiments of the subject disclosure as described herein. In another example, as described below, operating environment 1000 can be used to implement one or more of the example, non-limiting computer-implemented methods 500, 600, 700, 800, and/or 900 described above with reference to FIGS. 5-9. Repetitive description of like elements and/or processes employed in other embodiments described herein is omitted for sake of brevity.

The example, non-limiting multi-step fabrication sequences described above with reference to FIGS. 1 and 2, which can be implemented to fabricate device 100 and/or device 200, can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the example, non-limiting multi-step fabrication sequences described above with reference to FIGS. 1 and 2. As a non-limiting example, the one or more processors can facilitate performance of the example, non-limiting multi-step fabrication sequences described above with reference to FIGS. 1 and 2 by directing and/or controlling one or more systems and/or equipment operable to perform semiconductor and/or superconductor device fabrication.

In another example, one or more of the example, non-limiting computer-implemented methods 500, 600, 700, 800, and/or 900 described above with reference to FIGS. 5-9 can also be implemented (e.g., executed) by operating environment 1000. As a non-limiting example, the one or more processors of such a computing device (e.g., computer 1012) can facilitate performance of one or more of the example, non-limiting computer implemented methods 500, 600, 700, 800, and/or 900 described above with reference to FIGS. 5-9 by directing and/or controlling one or more systems and/or equipment (e.g., an AWG, a VNA, etc.) operable to perform the operations and/or routines of such computer-implemented method(s).

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A quantum coupler device, comprising:
   a tunable coupler coupled between a first terminal of a first qubit and a second terminal of a second qubit, the first terminal and the second terminal having a same polarity, wherein the tunable coupler is configured to control a first coupling between the first qubit and the second qubit; and a capacitor device coupled to the first terminal and a third terminal of the second qubit, the first terminal and the third terminal having an opposite polarity, wherein the capacitor device is configured to provide a second coupling opposite in sign relative to the first coupling and based on a resonant frequency of the tunable coupler being smaller than a resonant frequency of both the first qubit and the second qubit.

2. The quantum coupler device of claim 1, wherein the tunable coupler is configured to control the first coupling and the capacitor device is configured to provide the second coupling to eliminate coherent rotations between the first qubit and the second qubit, thereby facilitating at least one of: reduced quantum gate errors associated with at least one of the first qubit or the second qubit; increased speed of a quantum gate comprising the first qubit and the second qubit; improved performance of a quantum processor comprising the quantum coupler device; or improved fidelity of the quantum processor comprising the quantum coupler device.

3. The quantum coupler device of claim 1, wherein the tunable coupler comprises at least one of a flux tunable coupler, a tunable coupler qubit, a flux tunable coupler qubit, a tunable qubit, a tunable bus, or a flux tunable qubit bus.

4. The quantum coupler device of claim 1, wherein at least one of the first qubit or the second qubit comprises at least one of a fixed frequency qubit, a tunable qubit, a transmon qubit, a fixed frequency transmon qubit, or a tunable transmon qubit.

5. The quantum coupler device of claim 1, wherein the capacitor device comprises at least one of a differential capacitor or a bypass capacitor.

6. A quantum coupler device, comprising:
a tunable coupler coupled between a first qubit and a second qubit; and
a capacitor device coupled between the first qubit and the second qubit,
wherein the capacitor device generates a coupling that is opposite in sign to a coupling from the tunable coupler based on a resonant frequency of the tunable coupler being smaller than a resonant frequency of both the first qubit and the second qubit.

7. The quantum coupler device of claim 6, wherein the capacitor device comprises a first terminal and a second terminal, the first terminal and the second terminal cross coupled between the first qubit and the second qubit, and wherein the tunable coupler is directly coupled between the first qubit and the second qubit.

8. The quantum coupler device of claim 6, wherein the tunable coupler is coupled between terminals of a same polarity of the first qubit and the second qubit, and wherein the tunable coupler is configured to control a coupling between the first qubit and the second qubit.

9. The quantum coupler device of claim 6, wherein:
the tunable coupler is coupled between terminals of a same polarity of the first qubit and the second qubit;
the tunable coupler is configured to control a first coupling between the first qubit and the second qubit;
the capacitor device is coupled to terminals of an opposite polarity of the first qubit and the second qubit; and
the capacitor device is configured to provide a second coupling that is opposite in sign relative to the first coupling.

10. The quantum coupler device of claim 9, wherein the tunable coupler is configured to control the first coupling and the capacitor device is configured to provide the second coupling to eliminate coherent rotations between the first qubit and the second qubit, thereby facilitating at least one of: reduced quantum gate errors associated with at least one of the first qubit or the second qubit; increased speed of a quantum gate comprising the first qubit and the second qubit; improved performance of a quantum processor comprising the quantum coupler device; or improved fidelity of the quantum processor comprising the quantum coupler device.

11. The quantum coupler device of claim 6, wherein the tunable coupler comprises at least one of a flux tunable coupler, a tunable coupler qubit, a flux tunable coupler qubit, a tunable qubit, a tunable bus, or a flux tunable qubit bus.

12. The quantum coupler device of claim 6, wherein at least one of the first qubit or the second qubit comprises at least one of a fixed frequency qubit, a tunable qubit, a transmon qubit, a fixed frequency transmon qubit, or a tunable transmon qubit.

13. The quantum coupler device of claim 6, wherein the capacitor device comprises at least one of a differential capacitor or a bypass capacitor.

14. A device, comprising:
a first tunable coupler coupled between terminals of a same polarity of a first qubit and a second qubit, the first tunable coupler configured to control a first coupling between the first qubit and the second qubit;
a first capacitor device coupled to terminals of an opposite polarity of the first qubit and the second qubit, the first capacitor device configured to provide a second coupling that is opposite in sign relative to the first coupling;
a second tunable coupler coupled between terminals of a same polarity of the second qubit and a third qubit, the second tunable coupler configured to control a third coupling between the second qubit and the third qubit; and
a second capacitor device coupled to terminals of an opposite polarity of the second qubit and the third qubit, the second capacitor device configured to provide a fourth coupling that is opposite in sign relative to the third coupling.

15. The device of claim 14, wherein the first capacitor device provides the second coupling based on a resonant frequency of the first tunable coupler being smaller than a resonant frequency of both the first qubit and the second qubit, and wherein the second capacitor device provides the fourth coupling based on a resonant frequency of the second tunable coupler being smaller than a resonant frequency of both the second qubit and the third qubit.

16. The device of claim 14, wherein the first tunable coupler or the second tunable coupler is configured to respectively control the first coupling or the third coupling and the first capacitor device or the second capacitor device is configured to respectively provide the second coupling or the fourth coupling to respectively eliminate coherent rotations between the first qubit and the second qubit or between the second qubit and the third qubit, thereby facilitating at least one of: reduced quantum gate errors associated with at least one of the first qubit, the second qubit, or the third qubit; increased speed of a quantum gate comprising the first qubit and the second qubit or the second qubit and the third qubit; improved performance of a quantum processor comprising the device; or improved fidelity of the quantum processor comprising the device.

17. The device of claim 14, wherein:
at least one of the first tunable coupler or the second tunable coupler comprises at least one of a flux tunable coupler, a tunable coupler qubit, a flux tunable coupler qubit, a tunable qubit, a tunable bus, or a flux tunable qubit bus;

at least one of the first qubit, the second qubit, or the third qubit comprises at least one of a fixed frequency qubit, a tunable qubit, a transmon qubit, a fixed frequency transmon qubit, or a tunable transmon qubit; and at least one of the first capacitor device or the second capacitor device comprises at least one of a differential capacitor or a bypass capacitor.

* * * * *